United States Patent
Kitagawa et al.

(10) Patent No.: US 10,626,287 B2
(45) Date of Patent: Apr. 21, 2020

(54) RESIN COMPOSITION FOR UNDERLAYER FILM FORMATION, LAYERED PRODUCT, METHOD FOR FORMING PATTERN, AND PROCESS FOR PRODUCING DEVICE

(71) Applicant: FUJIFILM Corporation, Minato-ku, Tokyo (JP)

(72) Inventors: Hirotaka Kitagawa, Haibara-gun (JP); Tadashi Oomatsu, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 544 days.

(21) Appl. No.: 15/378,831

(22) Filed: Dec. 14, 2016

(65) Prior Publication Data

US 2017/0088743 A1    Mar. 30, 2017

Related U.S. Application Data

(63) Continuation of application No. PCT/JP2015/067194, filed on Jun. 15, 2015.

(30) Foreign Application Priority Data

Jun. 20, 2014   (JP) ................. 2014-127041

(51) Int. Cl.
| | |
|---|---|
| C09D 133/14 | (2006.01) |
| C08F 8/14 | (2006.01) |
| B32B 27/30 | (2006.01) |
| C08F 290/14 | (2006.01) |
| C08F 290/06 | (2006.01) |
| G03F 7/00 | (2006.01) |
| G03F 7/09 | (2006.01) |
| B05D 1/00 | (2006.01) |
| B05D 3/06 | (2006.01) |
| B05D 3/10 | (2006.01) |
| B05D 3/12 | (2006.01) |
| B29C 59/02 | (2006.01) |
| B29K 67/00 | (2006.01) |
| B29L 9/00 | (2006.01) |

(52) U.S. Cl.
CPC ........... *C09D 133/14* (2013.01); *B05D 1/005* (2013.01); *B05D 3/06* (2013.01); *B05D 3/107* (2013.01); *B05D 3/12* (2013.01); *B29C 59/022* (2013.01); *B29C 59/026* (2013.01); *B32B 27/30* (2013.01); *C08F 8/14* (2013.01); *C08F 290/062* (2013.01); *C08F 290/142* (2013.01); *G03F 7/0002* (2013.01); *G03F 7/0007* (2013.01); *G03F 7/094* (2013.01); *B29K 2067/04* (2013.01); *B29L 2009/005* (2013.01); *C08F 2438/03* (2013.01)

(58) Field of Classification Search
CPC ... C08L 33/068; C08L 33/066; C09D 133/08; B05D 3/06; B05D 3/02; B29C 59/022
See application file for complete search history.

(56) References Cited

U.S. PATENT DOCUMENTS

| | | |
|---|---|---|
| 2012/0288795 A1 | 11/2012 | Umezaki et al. |
| 2014/0220353 A1 | 8/2014 | Kodama et al. |
| 2015/0079804 A1 | 3/2015 | Kitagawa et al. |

FOREIGN PATENT DOCUMENTS

| | | |
|---|---|---|
| JP | 2009-503139 A | 1/2009 |
| JP | 2013-093552 A | 5/2013 |
| JP | 2014-024322 A | 2/2014 |
| KR | 10-2012-0105545 | 9/2012 |
| WO | 2007/050133 A2 | 5/2007 |
| WO | 2008078953 | * 7/2008 |

OTHER PUBLICATIONS

International Preliminary on Patentability Report dated Dec. 29, 2016, issued by the International Searching Authority in International Application No. PCT/JP2015/067194.
Stephen Y. Chou et al., "Imprint of sub-25 nm vias and trenches in polymers", Appl. Phys. Lett. Nov. 20, 1995, pp. 3114-3116, vol. 67, No. 21.
M. Colburn et al., "Step and Flash Imprint Lithography: A New Approach to High-Resolution Patterning", Proc. SPIE, Mar. 1999, pp. 379-389, vol. 3676.
International Search Report for PCT/JP2015/064194, dated Sep. 8, 2015 [PCT/ISA/210].
Written Opinion for PCT/JP2015/064194, dated Sep. 8, 2015 [PCT/ISA/237].
Office Action dated Dec. 7, 2017 from the Korean Intellectual Property Office in counterpart Korean Application No. 10-2016-7034688.

* cited by examiner

*Primary Examiner* — Kuo Liang Peng
(74) *Attorney, Agent, or Firm* — Sughrue Mion, PLLC

(57) ABSTRACT

A resin composition for underlayer film formation capable of forming an underlayer film having good adhesiveness and excellent surface flatness, a layered product, a method for forming a pattern and a process for producing a device are provided. The resin composition for underlayer film formation includes a resin having a group represented by General Formula (A) and a group represented by General Formula (B), and a solvent. Ra1 represents a hydrogen atom or a methyl group, Rb1 and Rb2 each independently represents an unsubstituted linear or branched alkyl group having 1 to 20 carbon atoms or an unsubstituted cycloalkyl group having 3 to 20 carbon atoms, Rb3 represents an unsubstituted linear or branched alkyl group having 2 to 20 carbon atoms or an unsubstituted cycloalkyl group having 3 to 20 carbon atoms, and Rb2 and Rb3 may be bonded to each other to form a ring.

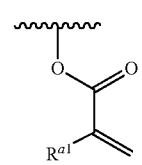

(A)

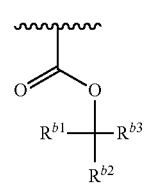

(B)

13 Claims, 1 Drawing Sheet

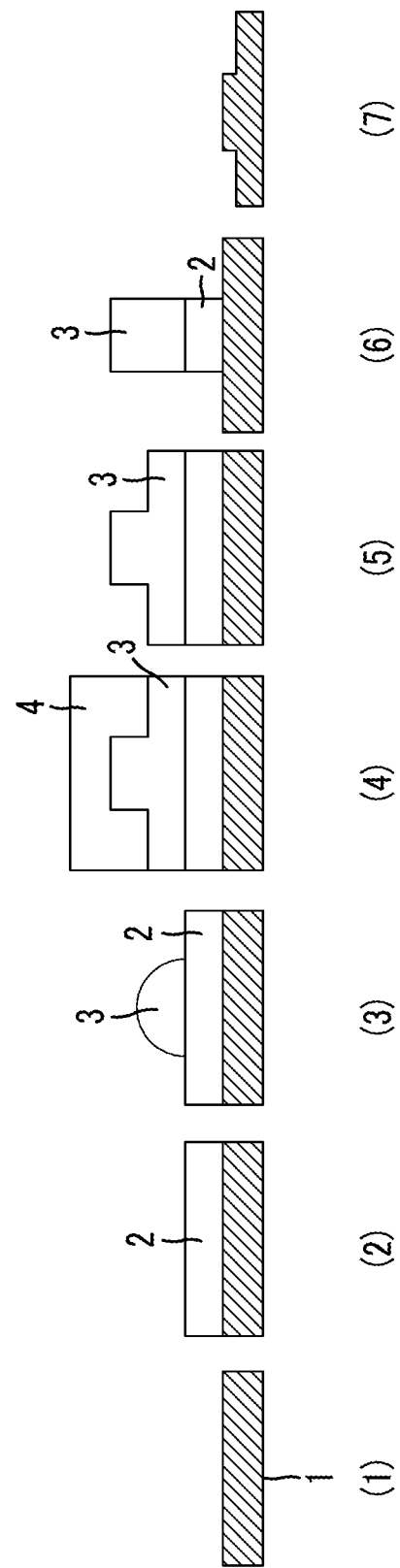

RESIN COMPOSITION FOR UNDERLAYER FILM FORMATION, LAYERED PRODUCT, METHOD FOR FORMING PATTERN, AND PROCESS FOR PRODUCING DEVICE

CROSS-REFERENCE TO RELATED APPLICATIONS

This application is a Continuation of PCT International Application No. PCT/JP2015/067194 filed on Jun. 15, 2015, which claims priority under 35 U.S.C § 119(a) to Japanese Patent Application No. 2014-127041 filed on Jun. 20, 2014. Each of the above application(s) is hereby expressly incorporated by reference, in its entirety, into the present application.

BACKGROUND OF THE INVENTION

1. Field of the Invention

The present invention relates to a resin composition for underlayer film formation, a layered product, a method for forming a pattern and a process for producing a device. More specifically, the present invention relates to a resin composition for underlayer film formation which is used for improving adhesiveness between a photocurable composition for imprints and a base material. More particularly, the present invention relates to a resin composition for underlayer film formation which is used for patterning through photoirradiation, and which is used in manufacturing of semiconductor integrated circuits, flat screens, microelectromechanical systems (MEMS), sensor devices, optical discs, magnetic recording media such as high-density memory disks, optical members such as diffraction gratings and relief holograms, optical films or polarizing elements for production of nanodevices, optical devices, and flat panel displays, thin-film transistors in liquid-crystal displays, organic transistors, color filters, overcoat layers, pillar materials, rib materials for liquid crystal alignment, microlens arrays, immunoassay chips, DNA separation chips, microreactors, nanobio devices, optical waveguides, optical filters, photonic liquid crystals, and molds for imprints.

2. Description of the Related Art

Imprint technology is a development advanced from embossing technology well known in the art of optical disc production, which includes pressing a mold prototype with a concave-convex pattern formed on its surface (this is generally referred to as "mold", "stamper" or "template") against a resist to thereby accurately transfer a fine pattern onto the resist through mechanical deformation of the resist. In this technology, when a mold is prepared once, microstructures such as nanostructures can then be easily and repeatedly molded, and therefore, this is economical, and in addition, harmful wastes and discharges from this nanotechnology are reduced. Accordingly, in recent years, it has been anticipated that this will be applied to various technical fields.

Two methods of imprint technology have been proposed; one is a thermal imprint method using a thermoplastic resin as the material to be worked (for example, see S. Chou et al.: Appl. Phys. Lett. Vol. 67, 3114(1995)), and the other is an imprint method using a curable composition (for example, see M. Colburn et al: Proc. SPIE, Vol. 3676, 379 (1999)). In the thermal imprint method, a mold is pressed against a thermoplastic resin heated up to a temperature not lower than the glass transition temperature thereof, then the thermoplastic resin is cooled to a temperature not higher than the glass transition temperature thereof and thereafter the mold is released to thereby transfer the microstructure of the mold onto the resin on a substrate. This method is very simple and convenient, and is also applicable to a variety of resin materials and glass materials.

On the other hand, imprinting is a method of transferring a fine pattern onto a photo-cured material, by allowing a curable composition to photo-cure under photoirradiation through a light transmissive mold or a light transmissive substrate, and then separating the mold. This method is applicable to the field of high-precision processing for forming ultrafine patterns such as fabrication of semiconductor integrated circuits, since the imprinting may be implemented at room temperature. In recent years, new trends in development of nano-casting based on a combination of advantages of both, and reversal imprinting capable of creating a three-dimensional laminated structure have been reported.

In such an imprint method, the following applications have been proposed.

A first application relates to a geometry (pattern) itself obtained by molding being functionalized so as to be used as a nanotechnology component, or a structural member, examples of which include a variety of micro- or nano-optical components, high-density recording media, optical films, and structural members of flat panel displays.

A second application relates to the building-up of a laminated structure by simultaneous casting of microstructures and nanostructures or by simple layer-to-layer alignment, and use of the laminated structure for manufacturing a Micro-Total Analysis System (μ-TAS) or a biochip.

A third application relates to use of the thus-formed pattern as a mask through which a substrate is processed by a method such as etching. By virtue of high precision alignment and a high degree of integration, this technique can replace a conventional lithographic technique in fabrication of high-density semiconductor integrated circuits, fabrication of transistors in liquid crystal displays, and magnetic processing for next-generation hard disks referred to as patterned media. Efforts to use imprinting practically in these applications have recently become active.

With progress of activities in imprinting, adhesiveness between the substrate and the photocurable composition for imprints has come to be a problem. In imprinting, the photocurable composition for imprints is applied over the surface of the substrate, the photocurable composition for imprints is allowed to cure under photoirradiation, in a state of the surface of the substrate being in contact with a mold, and then the mold is separated. In the step of separating the mold, there may be a case where the cured product is separated from the substrate and unfortunately adheres to the mold. This is thought to be because the adhesiveness between the substrate and the cured material is lower than the adhesiveness between the mold and the cured material. As a solution to this problem, a resin composition for underlayer film formation for improving the adhesiveness between the substrate and the cured material has been studied (JP2009-503139A, JP2013-093552A, and JP2014-024322A).

SUMMARY OF THE INVENTION

The present inventors have examined JP2009-503139A, but found that surface flatness of an underlayer film is poor. It was found that poor surface flatness of the underlayer film results in insufficient pattern formability and adhesiveness.

In addition, although the resin composition for underlayer film formation disclosed in JP2013-093552A and JP2014-

024322A is capable of forming an underlayer film having excellent adhesiveness and surface flatness, further improvement has recently been required for adhesiveness between a base material and an imprint layer, and surface flatness.

Accordingly, an object of the present invention is to provide a resin composition for underlayer film formation capable of forming an underlayer film having good adhesiveness and excellent surface flatness, a layered product, a method for forming a pattern, and a process for producing a device.

As a result of extensive studies, the present inventors have found that it is possible for surface flatness and adhesiveness to be compatible, by using a resin described below having a group represented by General Formula (A) and a group represented by General Formula (B). The present invention has been completed based on such a finding. The present invention provides the following.

<1-0> A resin composition for underlayer film formation, comprising a resin having a group represented by General Formula (A) and a group represented by General Formula ($B^1$), and a solvent:

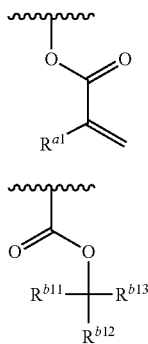

(A)

($B^1$)

in General Formulae (A) and ($B^1$), the wavy line represents a position connected to the main chain or side chain of the resin, $R^{a1}$ represents a hydrogen atom or a methyl group, and $R^{b11}$, $R^{b12}$, and $R^{b13}$ each independently represent a group selected from an unsubstituted linear or branched alkyl group having 1 to 20 carbon atoms and an unsubstituted cycloalkyl group having 3 to 20 carbon atoms, and two of $R^{b11}$, $R^{b12}$, and $R^{b13}$ may be bonded to each other to form a ring.

<1> A resin composition for underlayer film formation, comprising a resin having a group represented by General Formula (A) and a group represented by General Formula (B), and a solvent:

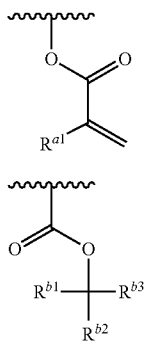

(A)

(B)

in General Formulae (A) and (B), the wavy line represents a position connected to the main chain or side chain of the resin, $R^{a1}$ represents a hydrogen atom or a methyl group, and $R^{b1}$ and $R^{b2}$ each independently represent a group selected from an unsubstituted linear or branched alkyl group having 1 to 20 carbon atoms and an unsubstituted cycloalkyl group having 3 to 20 carbon atoms, $R^{b3}$ represents a group selected from an unsubstituted linear or branched alkyl group having 2 to 20 carbon atoms and an unsubstituted cycloalkyl group having 3 to 20 carbon atoms, and $R^{b2}$ and $R^{b3}$ may be bonded to each other to form a ring.

<2> The resin composition for underlayer film formation according to <1>, in which, in General Formula (B), at least one of $R^{b1}$, $R^{b2}$, and $R^{b3}$ is a cycloalkyl group having 3 to 20 carbon atoms, or $R^{b2}$ and $R^{b3}$ are bonded to each other to form a ring.

<3> The resin composition for underlayer film formation according to <1> or <2>, in which the resin has at least one repeating unit selected from the following General Formulae (II) to (IV):

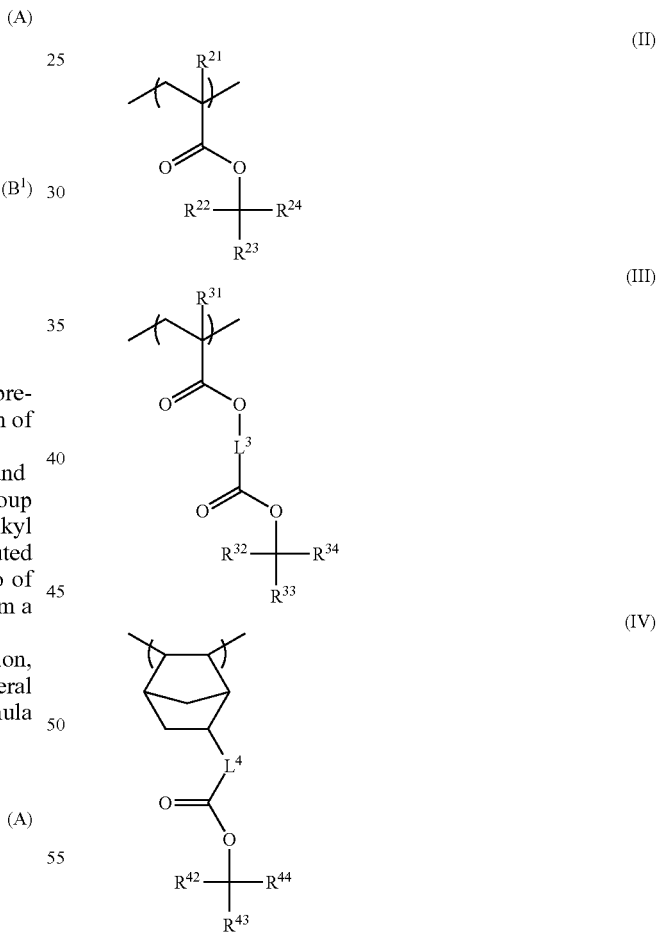

in General Formulae (II) to (IV), $R^{21}$ and $R^{31}$ each independently represent a hydrogen atom or a methyl group, $R^{22}$, $R^{23}$, $R^{32}$, $R^{33}$, $R^{42}$, and $R^{43}$ each independently represent a group selected from an unsubstituted linear or branched alkyl group having 1 to 20 carbon atoms and an unsubstituted cycloalkyl group having 3 to 20 carbon atoms, $R^{24}$, $R^{34}$, and $R^{44}$ each independently represent a group selected from an unsubstituted linear or branched alkyl group having 2 to 20 carbon atoms and an unsubstituted cycloalkyl group having 3 to 20 carbon atoms, and $R^{23}$ and $R^{24}$, $R^{33}$ and $R^{34}$, and $R^{43}$ and $R^{44}$ may be bonded to each other to form a ring, and $L^3$ and $L^4$ each independently represent a divalent linking group.

<4> The resin composition for underlayer film formation according to any one of <1> to <3>, in which the resin has a repeating unit represented by General Formula (I), and at least one of a repeating unit represented by General Formula (II) and a repeating unit represented by General Formula (III), and has a mass average molecular weight of 5000 to 50000:

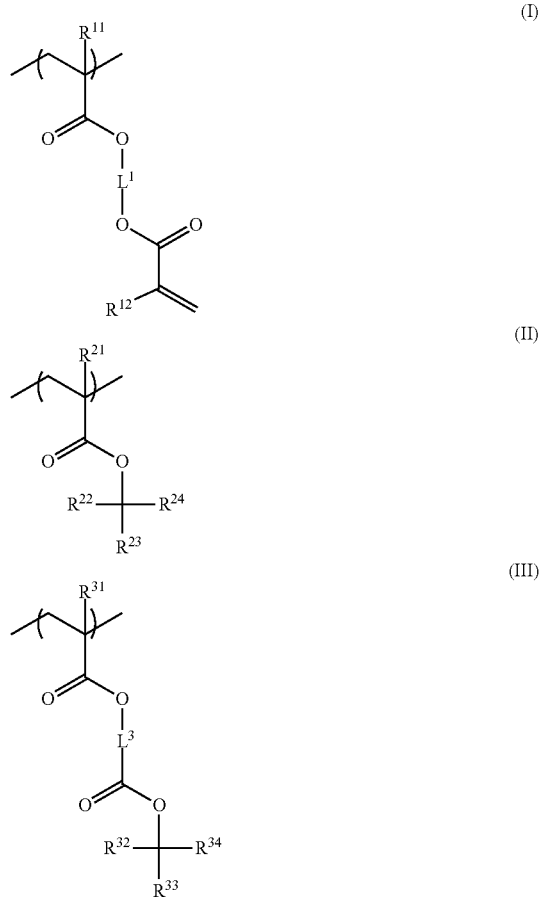

in General Formulae (I) to (III), $R^{11}$, $R^{12}$, $R^{21}$, $R^{31}$ each independently represent a hydrogen atom or a methyl group, $R^{22}$, $R^{23}$, $R^{32}$, and $R^{33}$ each independently represent a group selected from an unsubstituted linear or branched alkyl group having 1 to 20 carbon atoms and an unsubstituted cycloalkyl group having 3 to 20 carbon atoms, $R^{24}$ and $R^{34}$ each independently represent a group selected from an unsubstituted linear or branched alkyl group having 2 to 20 carbon atoms and an unsubstituted cycloalkyl group having 3 to 20 carbon atoms, and $R^{23}$ and $R^{24}$, and $R^{33}$ and $R^{34}$ may be bonded to each other to form a ring, and $L^1$ and $L^3$ each independently represent a divalent linking group.

<5> The resin composition for underlayer film formation according to <4>, in which the resin contains a repeating unit selected from a repeating unit where, in General Formula (II), at least one of $R^{22}$, $R^{23}$, and $R^{24}$ is a cycloalkyl group having 3 to 20 carbon atoms, or $R^{23}$ and $R^{24}$ are bonded to each other to form a ring, and a repeating unit where, in General Formula (III), at least one of $R^{32}$, $R^{33}$, and $R^{34}$ is a cycloalkyl group having 3 to 20 carbon atoms, or $R^{33}$ and $R^{34}$ are bonded to each other to form a ring.

<6> The resin composition for underlayer film formation according to <4> or <5>, in which the resin has a molar ratio of repeating units represented by General Formula (I) and a total of repeating units represented by General Formula (II) and repeating units represented by General Formula (III) of 5:95 to 95:5.

<7> The resin composition for underlayer film formation according to any one of <1> to <6>, in which the content of the resin is 0.1 to 5 mass %, and the content of the solvent is 95.0 to 99.9 mass %.

<8> The resin composition for underlayer film formation according to any one of <1> to <7>, in which the solvent is propylene glycol monomethyl ether acetate.

<9> The resin composition for underlayer film formation according to any one of <1> to <8>, further comprising an acid and/or a thermal acid generator.

<10> The resin composition for underlayer film formation according to any one of <1> to <9>, which is used for the formation of an underlayer film for imprints.

<11> A layered product having an underlayer film obtained by curing the resin composition for underlayer film formation according to any one of <1> to <10> on a surface of a base material.

<12> A method for forming a pattern, comprising:
a step of applying the resin composition for underlayer film formation according to any one of <I> to <10> onto a surface of a base material;
a step of heating the applied resin composition for underlayer film formation to form an underlayer film;
a step of applying a photocurable composition onto a surface of the underlayer film;
a step of pressing thereto a mold having a pattern;
a step of curing the photocurable composition by photoirradiation in a state of the mold being pressed; and
a step of separating the mold.

<13> The method for forming a pattern according to <12>, in which the heating temperature is 120° C. to 250° C. and the heating time is 30 seconds to 10 minutes, in the step of forming an underlayer film.

<14> A process for producing a device, comprising the method for forming a pattern according to <12> or <13>.

It has now become possible to provide a resin composition for underlayer film formation which is capable of forming an underlayer film having good adhesiveness and excellent surface flatness. Further, it has now become possible to provide a layered product, a method for forming a pattern, and a process for producing a device, each using such a resin composition for underlayer film formation.

BRIEF DESCRIPTION OF THE DRAWINGS

FIG. 1 illustrates an example of a manufacturing process in the case where a photocurable composition for imprints is used for processing of a base material by etching.

DESCRIPTION OF THE PREFERRED EMBODIMENTS

The contents of the present invention are described in detail hereinunder.

As used herein, the numerical value ranges shown with "to" means ranges including the numerical values indicated before and after "to" as the minimum and maximum values, respectively.

As used herein, the term "(meth)acrylate" refers to acrylate and methacrylate; "(meth)acrylic" refers to acrylic and methacrylic; and "(meth)acryloyl" refers to acryloyl and methacryloyl.

The term "monomer" as used herein refers to a compound which is differentiated from an oligomer and a polymer, and has a weight-average molecular weight of less than 1,000.

As used herein, the term "functional group" refers to a group which takes part in a polymerization reaction.

As used herein, the term "imprint" is preferably meant to indicate pattern transfer in a size of 1 nm to 10 mm and more preferably meant to indicate pattern transfer in a size of about 10 nm to 100 μm (nanoimprint).

Regarding the expression of "group (atomic group)" as used herein, the expression with no indication of "substituted" or "unsubstituted" includes both "substituted group" and "unsubstituted group". For example, "alkyl group" includes not only an alkyl group not having a substituent (unsubstituted alkyl group) but also an alkyl group having a substituent (substituted alkyl group).

As used herein, the term "light" includes not only those in the wavelength regions of ultraviolet, near-ultraviolet, far ultraviolet, visible light and infrared, and other electromagnetic waves, but also radiation rays. The radiation rays include microwaves, electron beams, EUV and X-rays. Laser light such as 248 nm excimer laser, 193 nm excimer laser, and 172 nm excimer laser may also be used. These sorts of light may be monochromatic light (single wavelength light) which have passed through an optical filter, or light that includes a plurality of different wavelengths (complex light).

Unless otherwise specified, the mass average molecular weight and the number average molecular weight in the present invention refer to those as measured by gel permeation chromatography (GPC). For GPC, with respect to the obtained polymer, the solvent is removed to isolate the polymer and the resulting solids are diluted with tetrahydrofuran to 0.1 mass %. In the GPC, the measurement is carried out by using HLC-8020GPC (manufactured by Tosoh Corporation) with three columns of TSKgel Super Multipore HZ-H (manufactured by Tosoh Corporation, 4.6 mmID×15 cm) connected in series as columns. The measurement was performed using an RI detector under the conditions of a sample concentration of 0.35 mass %, a flow rate of 0.35 mL/min, a sample injection volume of 10 μL, and a measurement temperature of 40° C.

As used herein, the term "total solid content" refers to a total mass of component(s) remaining when a solvent is excluded from the entire composition.

The "solid content" in the present specification is a solid content at 25° C.

The resin composition for underlayer film formation according to the present invention includes a resin having a group represented by General Formula (A) and a group represented by General Formula ($B^1$), and a solvent.

The resin composition for underlayer film formation according to the present invention can improve adhesiveness to an imprint layer or the like, by having a group represented by General Formula (A).

Further, the group represented by General Formula ($B^1$) is a carboxyl group protected by a tertiary carbon. The protected carboxyl group is subjected to a deprotection reaction by an acid and/or heating, which produces a carboxyl group and therefore can improve adhesiveness to a base material, an imprint layer, or the like. Further, the resin composition for underlayer film formation according to the present invention having a carboxyl group protected by a tertiary carbon can suppress an increase of viscosity in response to drying of a solvent in a step of drying a solvent after coating thereof and can improve the surface flatness, because the interaction between polymer chains is weak.

As seen from the above, adhesiveness to an imprint layer, adhesiveness to a base material, and flatness of an underlayer film surface are improved, whereby it is possible to effectively suppress separation of an imprint layer or the like during separation of a mold.

The resin composition for underlayer film formation according to the present invention can be preferably used in the formation of an underlayer film for imprints.

Hereinafter, individual components of the resin composition for underlayer film formation according to the present invention will be described.

<<Resin>>

In the resin composition for underlayer film formation according to the present invention, the resin has a group represented by General Formula (A) and a group represented by General Formula ($B^1$).

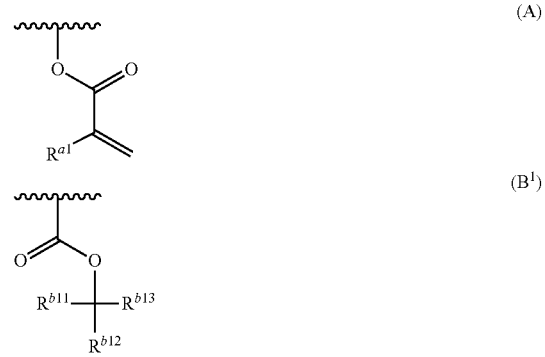

In General Formulae (A) and ($B^1$), the wavy line represents a position connected to the main chain or side chain of the resin, $R^{a1}$ represents a hydrogen atom or a methyl group, and $R^{b11}$, $R^{b12}$, and $R^{b13}$ each independently represent a group selected from an unsubstituted linear or branched alkyl group having 1 to 20 carbon atoms and an unsubstituted cycloalkyl group having 3 to 20 carbon atoms, and two of $R^{b11}$, $R^{b12}$, and $R^{b13}$ may be bonded to each other to form a ring.

$R^{b11}$, $R^{b12}$, and $R^{b13}$ each independently represent a group selected from an unsubstituted linear or branched alkyl group having 1 to 20 carbon atoms and an unsubstituted cycloalkyl group having 3 to 10 carbon atoms.

The number of carbon atoms in the unsubstituted linear alkyl group is preferably 1 to 20, more preferably 1 to 15, and still more preferably 1 to 10. Specific examples of the unsubstituted linear alkyl group include a methyl group, an ethyl group, a propyl group, a hexyl group, and an octyl group.

The number of carbon atoms in the unsubstituted branched alkyl group is preferably 3 to 20, more preferably 3 to 15, and still more preferably 3 to 10. Specific examples of the unsubstituted branched alkyl group include an iso-propyl group, an n-butyl group, a sec-butyl group, a tert-butyl group, and an iso-butyl group.

The number of carbon atoms in the unsubstituted cycloalkyl group is preferably 3 to 20, more preferably 3 to 15, and still more preferably 3 to 10. The cycloalkyl group may be monocyclic or may be polycyclic. Specific examples of the unsubstituted cycloalkyl group include a cyclopropyl group, a cyclobutyl group, a cyclopentyl group, a cyclohexyl group, a norbornyl group, an isobornyl group, a camphanyl group, an adamantyl group, a dicyclopentyl group, an α-pinel group, and a tricyclodecanyl group.

Two of $R^{b11}$, $R^{b12}$, and $R^{b13}$ may be bonded to each other to form a ring. Examples of the ring formed by bonding of two of $R^{b11}$, $R^{b12}$, and $R^{b13}$ to each other include a cyclopentane ring, a cyclohexane ring, a norbornane ring, an isobornane ring, and an adamantane ring.

Further, it is not preferable to form a ring by bonding of $R^{b11}$, $R^{b12}$, and $R^{b13}$ to one another. This is because the deprotection reaction of a tertiary ester by an acid and/or heating hardly proceeds since carbocations at the bridgehead position are not stable. Examples of the group not preferable as —C($R^{b11}$)($R^{b12}$)($R^{b13}$) include a 1-adamantyl group, a norborn-1-yl group, and an isoborn-1-yl group.

In the resin composition for underlayer film formation according to the present invention, the resin preferably has a group represented by the following General Formula (A), and a group represented by the following General Formula (B).

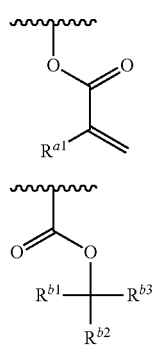

In General Formulae (A) and (B), the wavy line represents a position connected to the main chain or side chain of the resin, $R^{a1}$ represents a hydrogen atom or a methyl group, and $R^{b1}$ and $R^{b2}$ each independently represent a group selected from an unsubstituted linear or branched alkyl group having 1 to 20 carbon atoms and an unsubstituted cycloalkyl group having 3 to 20 carbon atoms, $R^{b3}$ represents a group selected from an unsubstituted linear or branched alkyl group having 2 to 20 carbon atoms and an unsubstituted cycloalkyl group having 3 to 20 carbon atoms, and $R^{b2}$ and $R^{b3}$ may be bonded to each other to form a ring.

$R^{b1}$ and $R^{b2}$ each independently represent a group selected from an unsubstituted linear or branched alkyl group having 1 to 20 carbon atoms and an unsubstituted cycloalkyl group having 3 to 20 carbon atoms.

Preferred ranges of $R^{b1}$ and $R^{b2}$ have the same definition as in $R^{b11}$ and $R^{b12}$ of the above-mentioned Formula ($B^1$), and preferred ranges thereof are also the same.

$R^{b3}$ represents a group selected from an unsubstituted linear or branched alkyl group having 2 to 20 carbon atoms and an unsubstituted cycloalkyl group having 3 to 20 carbon atoms.

The number of carbon atoms in the linear unsubstituted alkyl group is preferably 2 to 20, more preferably 2 to 15, and still more preferably 2 to 10. Specific examples of the linear unsubstituted alkyl group include an ethyl group, a propyl group, a hexyl group, and an octyl group.

Preferred ranges of the unsubstituted branched alkyl group and the unsubstituted cycloalkyl group have the same definition as in $R^{b13}$ of the above-mentioned formula ($B^1$), and preferred ranges thereof are also the same.

Examples of the ring formed by bonding of $R^{b2}$ and $R^{b3}$ to each other include a cyclopentane ring, a cyclohexane ring, a norbornane ring, an isobornane ring, and an adamantane ring.

The resin has a group represented by General Formula (B). The group represented by General Formula (B) is more readily susceptible to the deprotection reaction of a tertiary ester by an acid and/or heating, due to carbocation intermediates in the deprotection reaction, or low energy of the transition state of the reaction. Therefore, it is easy to form an underlayer film having a high adhesive force to an imprint layer and a substrate.

In General Formula (B), it is preferred that at least one of $R^{b1}$, $R^{b2}$, or $R^{b3}$ is a cycloalkyl group having 3 to 20 carbon atoms, or $R^{b2}$ and $R^{b3}$ are bonded to each other to form a ring. According to this aspect, since the carbocation is likely to exist more stably, the deprotection reaction of a tertiary ester is more likely to proceed by an acid and/or heating.

In the present invention, the resin preferably has at least one repeating unit selected from General Formulae (II) to (IV).

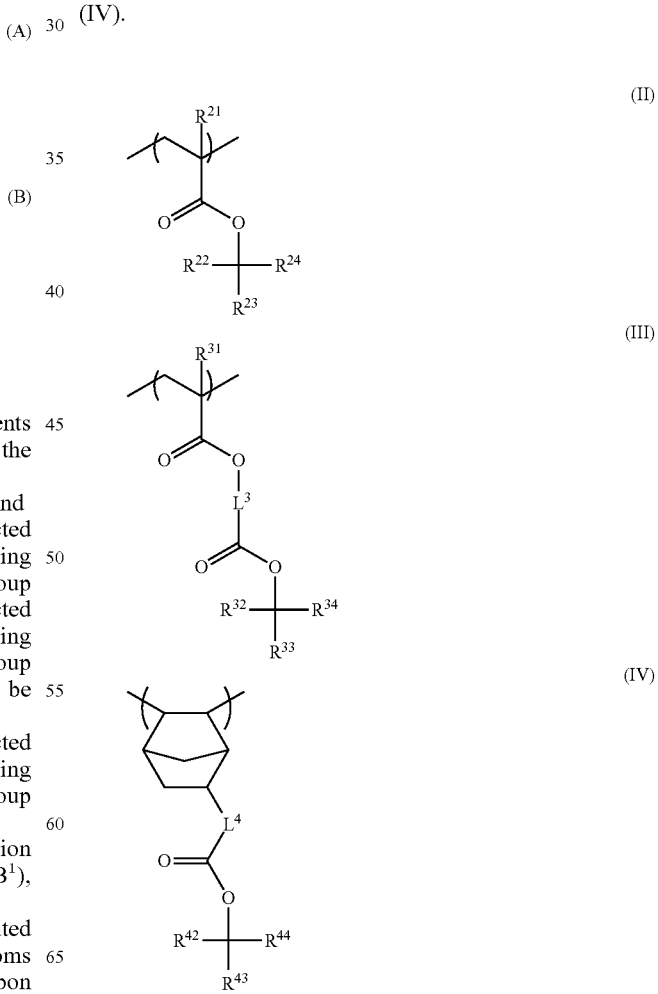

In General Formulae (II) to (IV), $R^{21}$ and $R^{31}$ each independently represent a hydrogen atom or a methyl group, $R^{22}$, $R^{23}$, $R^{32}$, $R^{33}$, $R^{42}$, and $R^{43}$ are each independently a group selected from an unsubstituted linear or branched alkyl group having 1 to 20 carbon atoms and an unsubstituted cycloalkyl group having 3 to 20 carbon atoms, $R^{24}$, $R^{34}$, and $R^{44}$ are each independently a group selected from an unsubstituted linear or branched alkyl group having 2 to 20 carbon atoms and an unsubstituted cycloalkyl group having 3 to 20 carbon atoms, and $R^{23}$ and $R^{24}$, $R^{33}$ and $R^{34}$, and $R^{43}$ and $R^{44}$ may be bonded to each other to form a ring, and $L^3$ and $L^4$ each independently represent a divalent linking group.

$R^{22}$, $R^{23}$, $R^{32}$, $R^{33}$, $R^{42}$, and $R^{43}$ have the same definition as in $R^{b1}$ and $R^{b2}$ of the above-mentioned General Formula (B), and preferred ranges thereof are also the same.

$R^{24}$, $R^{34}$, and $R^{44}$ have the same definition as in $R^{b3}$ of the above-mentioned General Formula (B), and preferred ranges thereof are also the same. Further, $R^{44}$ may be a group selected from an unsubstituted linear or branched alkyl group having 1 to 20 carbon atoms and an unsubstituted cycloalkyl group having 3 to 20 carbon atoms. That is, $R^{44}$ may be a methyl group.

$L^3$ and $L^4$ each independently represent a divalent linking group.

Examples of the divalent linking group include a linear or branched alkylene group, a cycloalkylene group, and a group formed by combining these groups. These groups may contain at least one selected from an ester bond, an ether bond, an amide bond, and a urethane bond. Additionally, these groups may be unsubstituted or may have a substituent. The substituent may be a hydroxyl group or the like. In the present invention, it is preferred not to contain a substituent other than a hydroxyl group.

The number of carbon atoms in the linear alkylene group is preferably 2 to 10.

The number of carbon atoms in the branched alkylene group is preferably 3 to 10.

The number of carbon atoms in the cycloalkylene group is preferably 3 to 10.

Specific examples of the divalent linking group include an ethylene group, a propylene group, a butylene group, a hexylene group, a 2-hydroxy-1,3-propanediyl group, a 3-oxa-1,5-pentanediyl group, and a 3,5-dioxa-1,8-octanediyl group.

<<<Preferred Aspect of Resin>>>

In the present invention, the resin preferably has a repeating unit represented by General Formula (I), and at least one of a repeating unit represented by General Formula (II) or a repeating unit represented by General Formula (III).

By having a repeating unit represented by General Formula (I), the resin can improve adhesiveness to an imprint layer. By having at least one of a repeating unit represented by General Formula (II) or a repeating unit represented by General Formula (III), it is possible to improve surface flatness and adhesiveness to a base material. Further, adhesiveness to an imprint layer, adhesiveness to a base material, and flatness of an underlayer film surface are improved, whereby separation failure is unlikely to occur. Further, by using a resin containing the above-mentioned repeating units, it is possible to cure an underlayer film without using a low molecular weight crosslinking agent or the like, and it is possible to avoid occurrence of defects due to the sublimation of a crosslinking agent at the time of curing.

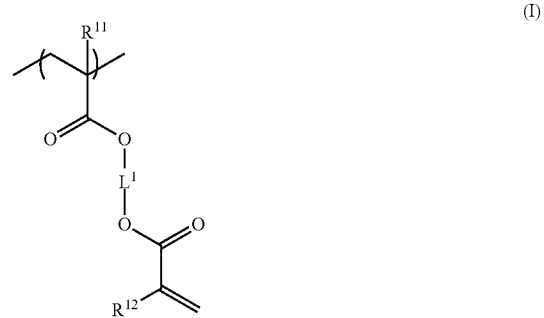

(I)

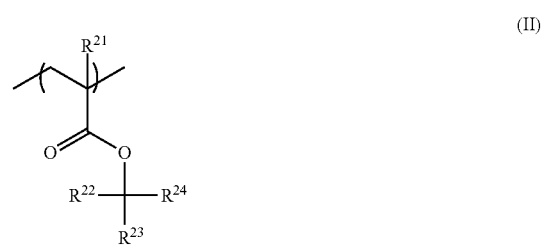

(II)

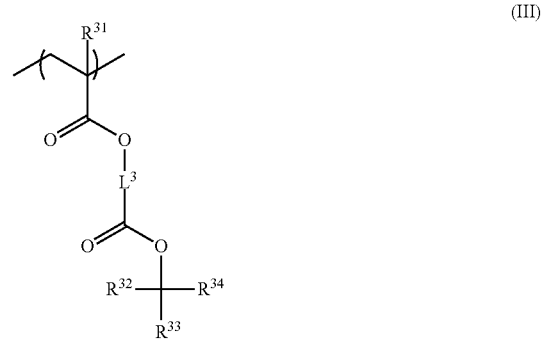

(III)

In General Formulae (I) to (III), $R^{11}$, $R^{12}$, $R^{21}$, and $R^{31}$ each independently represent a hydrogen atom or a methyl group, $R^{22}$, $R^{23}$, $R^{32}$, and $R^{33}$ are each independently a group selected from an unsubstituted linear or branched alkyl group having 1 to 20 carbon atoms and an unsubstituted cycloalkyl group having 3 to 20 carbon atoms, $R^{24}$ and $R^{34}$ are each independently a group selected from an unsubstituted linear or branched alkyl group having 2 to 20 carbon atoms and an unsubstituted cycloalkyl group having 3 to 20 carbon atoms, and $R^{23}$ and $R^{24}$, and $R^{33}$ and $R^{34}$ may be bonded to each other to form a ring, and $L^1$ and $L^3$ each independently represent a divalent linking group.

$R^{22}$, $R^{23}$, $R^{32}$, and $R^{33}$ have the same definition as in $R^{b1}$ and $R^{b2}$ of the above-mentioned General Formula (B), and preferred ranges thereof are also the same.

$R^{24}$ and $R^{34}$ have the same definition as in $R^{b3}$ of the above-mentioned General Formula (B), and preferred ranges thereof are also the same.

$L^1$ and $L^3$ each independently represent a divalent linking group.

The divalent linking group has the same definition as in the above-mentioned divalent linking group, and a preferred range thereof is also the same.

In the present invention, the resin preferably contains a repeating unit selected from a repeating unit where, in General Formula (II), at least one of $R^{22}$, $R^{23}$, or $R^{24}$ is a cycloalkyl group having 3 to 20 carbon atoms, or $R^{23}$ and $R^{24}$ are bonded to each other to form a ring, and a repeating unit where, in General Formula (III), at least one of $R^{32}$, $R^{33}$, or $R^{34}$ is a cycloalkyl group having 3 to 20 carbon atoms, or $R^{33}$ and $R^{34}$ are bonded to each other to form a ring. According to this aspect, the deprotection reaction of a tertiary ester is more likely to proceed by an acid and/or heating, since carbocations are likely to exist more stably.

In the present invention, the molar ratio of repeating units represented by General Formula (I): a total of repeating units represented by General Formula (II) and repeating units represented by General Formula (III) in the resin is preferably 5:95 to 95:5, more preferably 10:90 to 90:10, still more preferably 20:80 to 80:20, particularly preferably 30:70 to 70:30, and even more preferably 40:60 to 60:40.

When the percentage of General Formula (I) is set to 5 mol % or more, adhesiveness to an imprint layer can be preferably improved. When the percentage of a repeating unit selected from General Formula (II) and General Formula (III) is set to 5 mol % or more, adhesiveness to a base material and surface flatness can be preferably improved.

In the present invention, the resin may contain the other repeating unit other than repeating units represented by General Formulae (I) to (III). Examples of the other repeating unit include a repeating unit represented by the above-mentioned General Formula (IV). Further examples of the other repeating unit include a repeating unit described in paragraphs "0022" to "0055" of JP2014-24322A, and a repeating unit represented by General Formula (V) and a repeating unit represented by General Formula (VI) described in paragraph "0043" of the same JP2014-24322A.

The content of the other repeating unit is preferably 10 mol % or less, more preferably 5 mol % or less, and still more preferably 1 mol % or less, with respect to the total content of repeating units in the resin. Further, it is also possible that the other repeating unit is not contained. In the case where the resin is composed only of repeating units represented by General Formulae (I) to (III), the above-mentioned effects of the present invention are more significantly obtained.

Specific examples of the repeating unit represented by General Formula (I) include the following structures. It is needless to say that the present invention is not limited thereto. $R^{11}$ and $R^{12}$ each independently represent a hydrogen atom or a methyl group, preferably a methyl group.

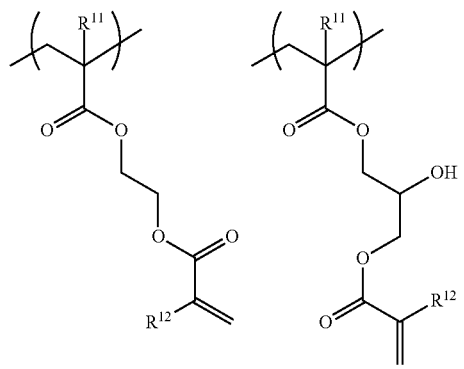

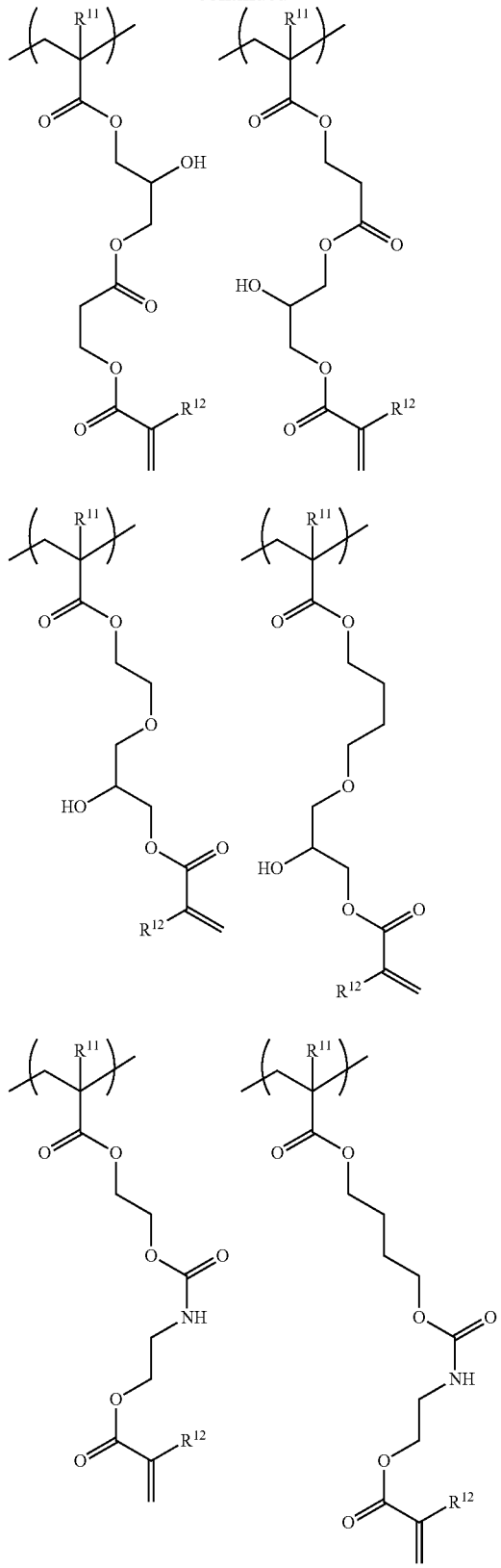

Among the above structures, a repeating unit represented by General Formula (I-1) is preferable from the viewpoint of cost.

(I-1)
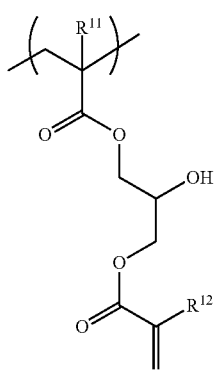
Specific examples of the repeating unit represented by General Formula (II) include the following structures.
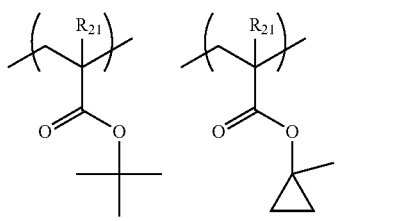
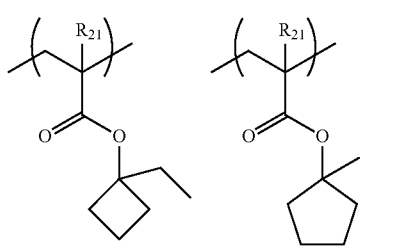
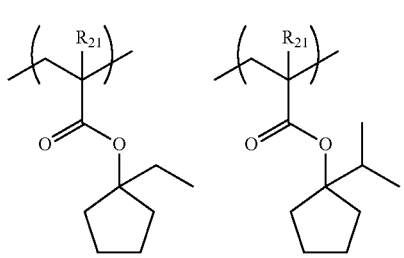
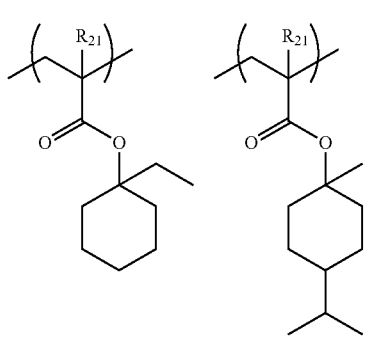
-continued
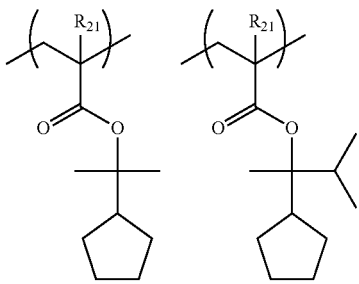
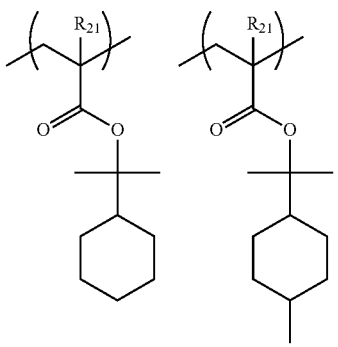
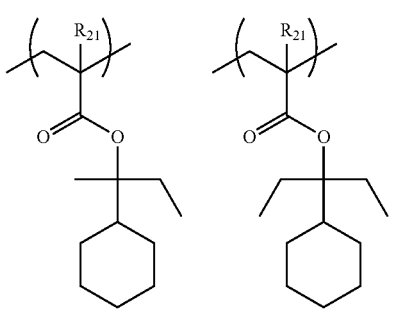
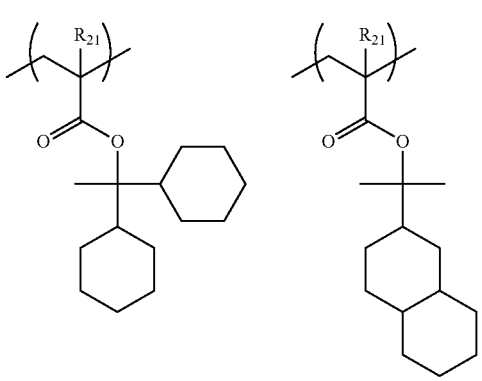
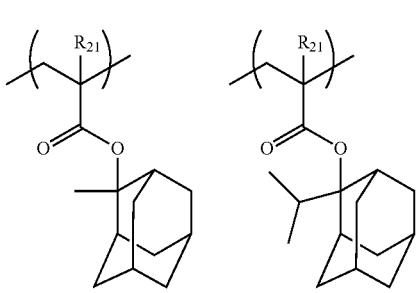

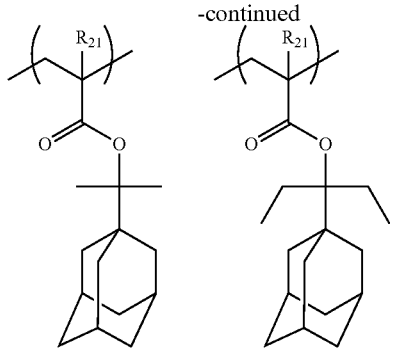
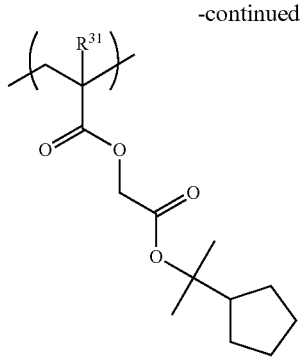
Among the above structures, the following repeating unit is preferable from the viewpoint of deprotection properties, volatility of the deprotected product, and cost.
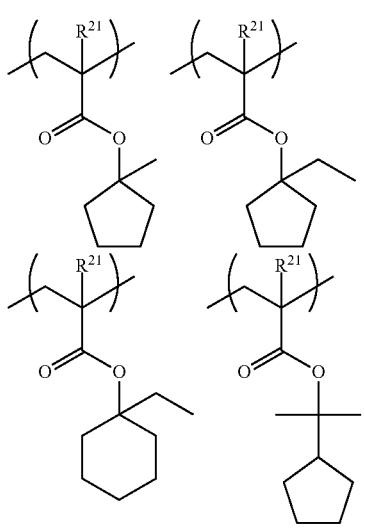
Specific examples of the repeating unit represented by General Formula (III) include the following structures.
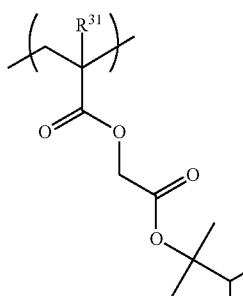
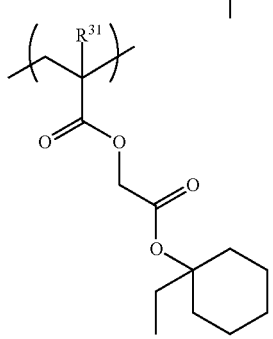
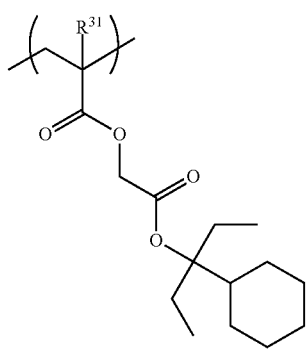
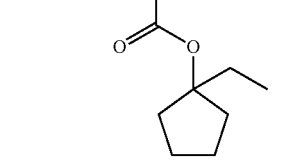
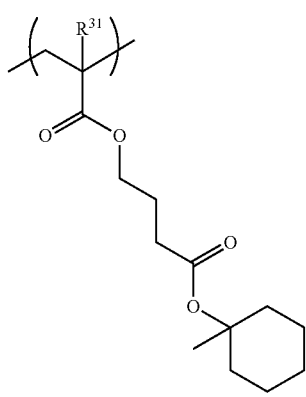

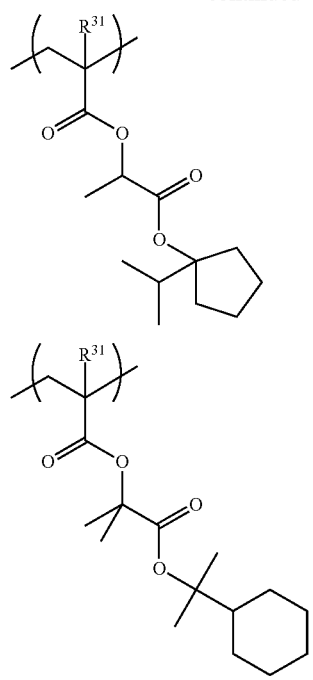
Specific examples of the repeating unit represented by General Formula (IV) include the following structures.
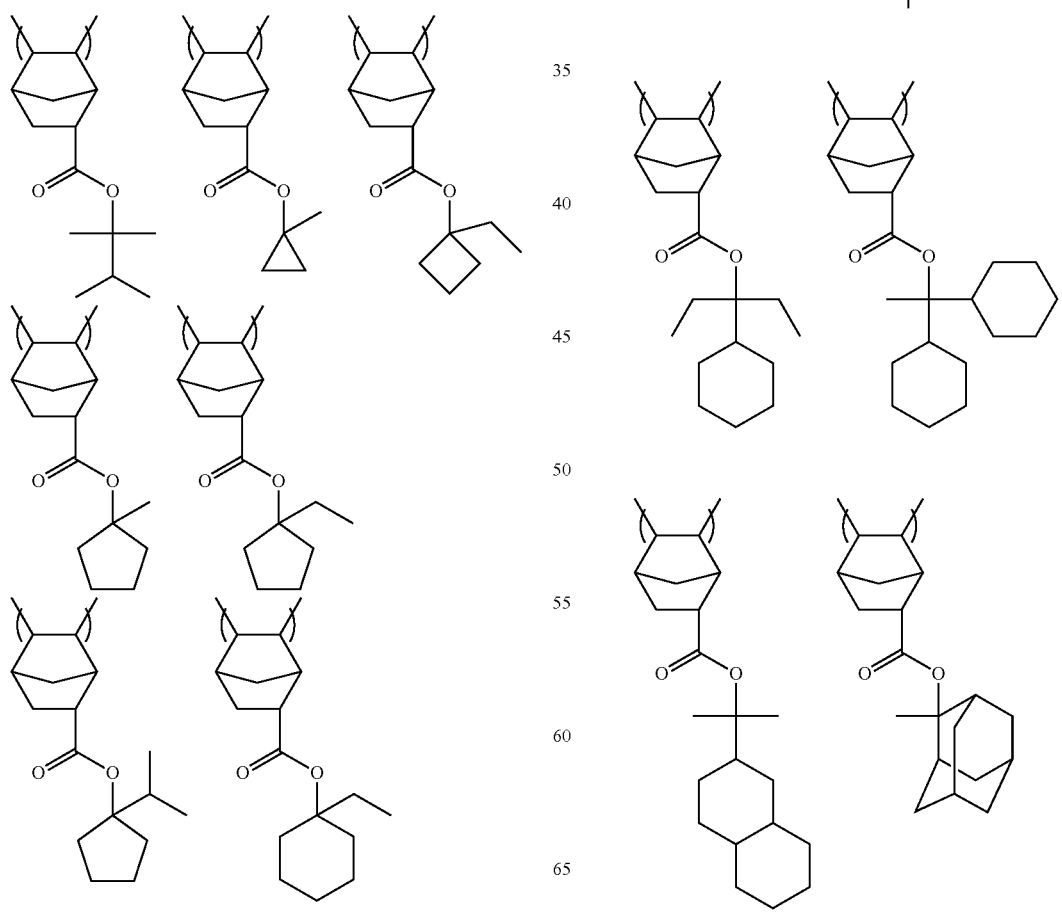
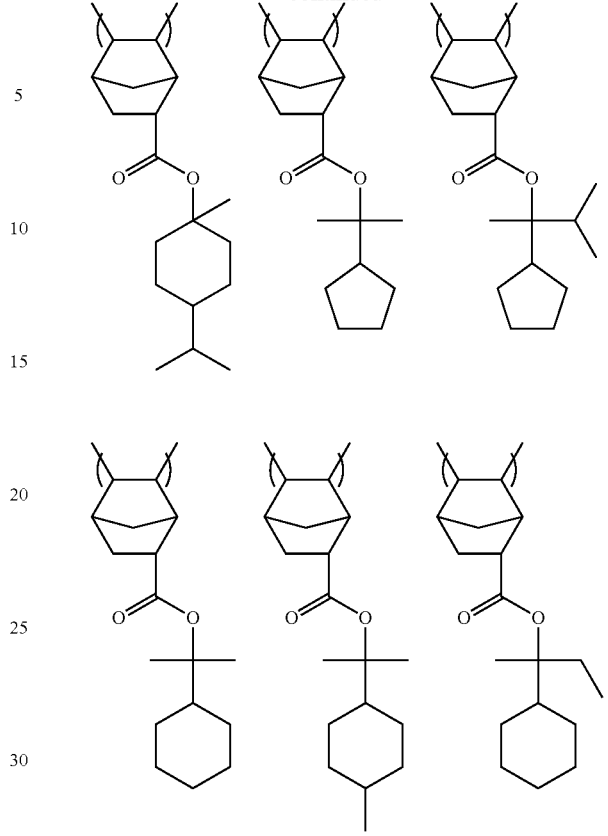

-continued
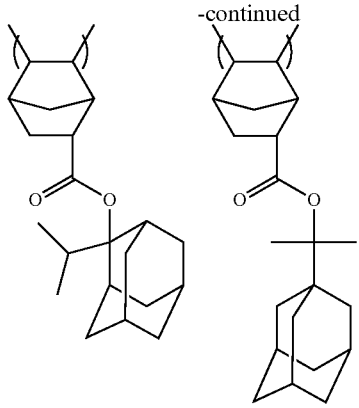
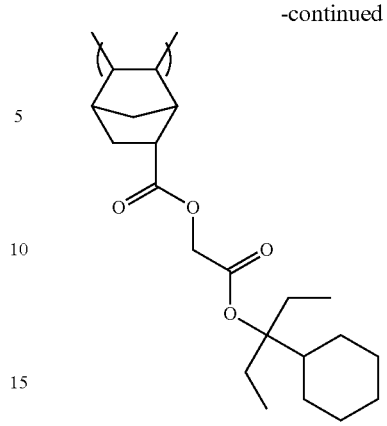
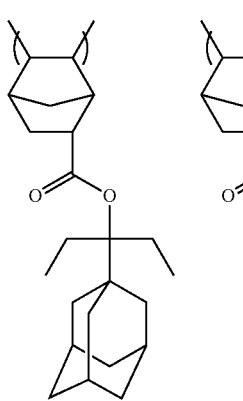
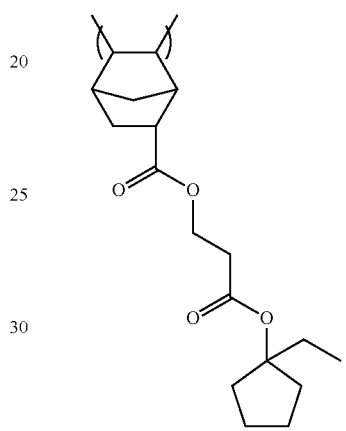
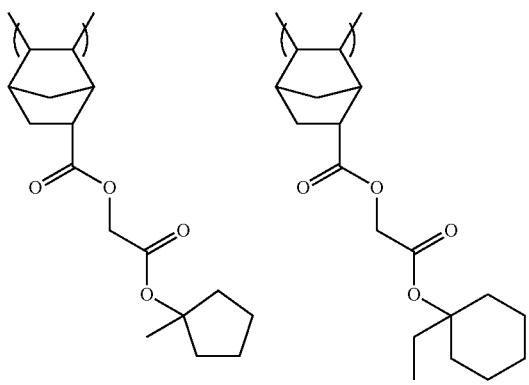
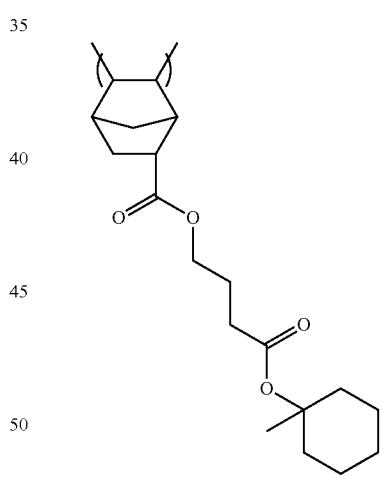
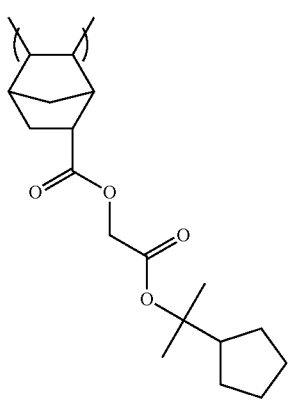
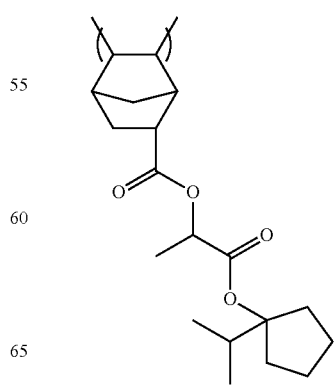

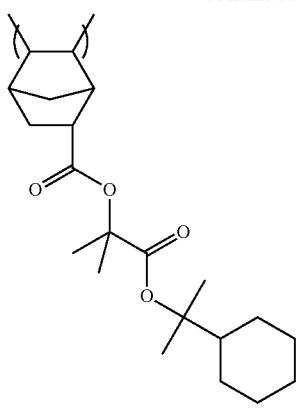

Hereinafter, specific examples of the resin are shown below. In the following specific examples, x represents 5 to 99 mol %, and y represents 5 to 95 mol %.

(A1)
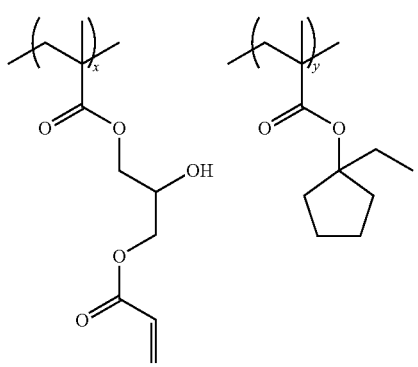

(A2)
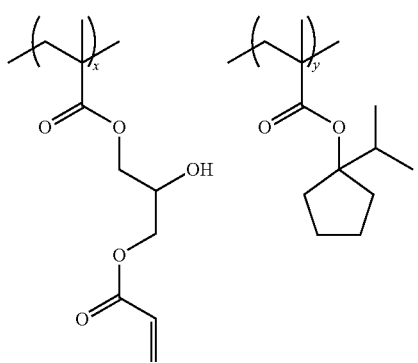

(A3)
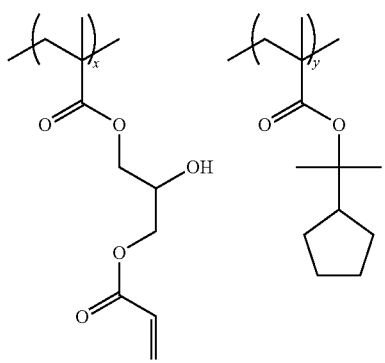

(A4)
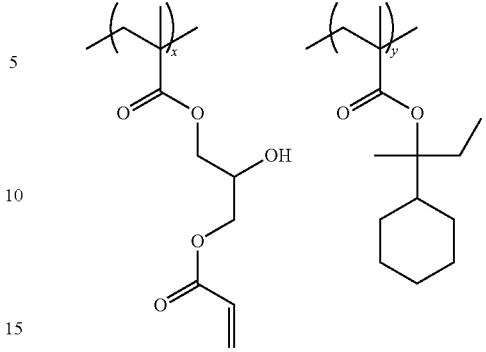

(A5)

(A6)
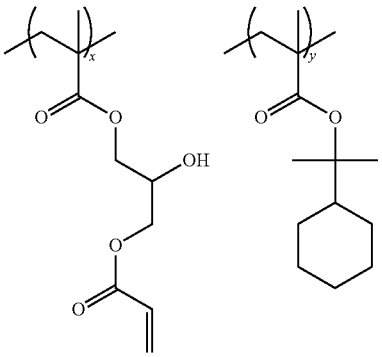

(A7)
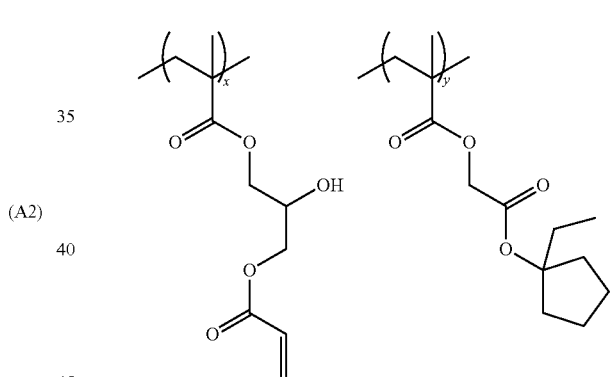
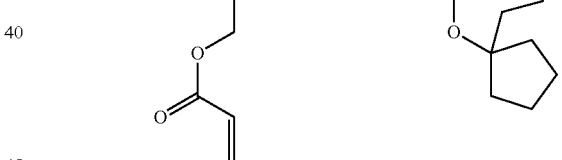
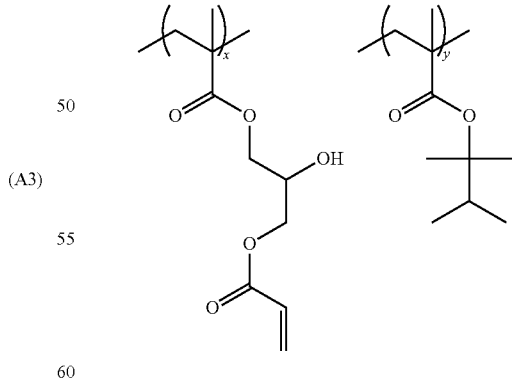

The mass average molecular weight of the resin is preferably 5,000 to 50,000. The lower limit of the mass average molecular weight of the resin is more preferably 8,000 or more, and still more preferably 10,000 or more. The upper limit of the mass average molecular weight of the resin is more preferably 35,000 or less, and still more preferably 25,000 or less. By setting the mass average molecular weight to the above-specified range, it is possible to achieve good film formability.

The content of the resin in the resin composition for underlayer film formation according to the present invention is preferably 50 mass % or more, more preferably 70 mass % or more, still more preferably 90 mass % or more, and particularly preferably 95 mass % or more, based on the total solid content of the resin composition for underlayer film formation.

The resin is present in an amount of preferably 0.05 to 1.0 mass %, more preferably 0.05 to 0.5 mass %, and still more preferably 0.05 to 0.3 mass %, based on the total amount of the resin composition for underlayer film formation.

If the content of the resin is within the above-specified range, it is easy to form an underlayer film having better adhesiveness and surface flatness.

The resins may be used alone or in combination of two or more thereof. In the case where two or more resins are used, it is preferred that the total amount of the resins is within the above-specified range.

<<Solvent>>

The resin composition for underlayer film formation according to the present invention contains a solvent. The solvent is preferably an organic solvent, and more preferably an organic solvent having a boiling point of 80° C. to 200° C. at normal pressures. Any solvent may be used as long as it is a solvent capable of dissolving individual components constituting a resin composition for underlayer film formation. Examples of the solvent include an organic solvent having any one or more of an ester group, a carbonyl group, a hydroxyl group and an ether group. More specifically, preferred examples of the organic solvent include propylene glycol monomethyl ether acetate (PGMEA), ethoxyethyl propionate, cyclohexanone, 2-heptanone, γ-butyrolactone, butyl acetate, propylene glycol monomethyl ether, and ethyl lactate. Among them, PGEMA, ethoxyethyl propionate, and 2-heptanone are more preferable, and PGMEA is particularly preferable. Two or more organic solvents may be used in combination thereof. A mixed solvent of an organic solvent having a hydroxyl group and an organic solvent having no hydroxyl group is also preferable.

The content of the organic solvent in the resin composition for underlayer film formation is optimally adjusted depending on the viscosity of the composition and a desired film thickness of an underlayer film. From the viewpoint of coatability, the amount of the organic solvent to be added is preferably 95.0 to 99.9 mass %, more preferably 98.0 to 99.9 mass %, still more preferably 99.0 to 99.9 mass %, particularly preferably 99.5 to 99.9 mass %, and most preferably 99.70 to 99.95 mass %, with respect to the resin composition for underlayer film formation.

<<Acid, and Thermal Acid Generator>>

The resin composition for underlayer film formation according to the present invention also preferably contains an acid and/or a thermal acid generator. By including an acid and/or a thermal acid generator, it is possible to cure the resin composition for underlayer film formation at a relatively low heating temperature (also referred to as baking temperature).

Examples of the acid include p-toluenesulfonic acid, 10-camphorsulfonic acid, and perfluorobutane sulfonic acid.

The thermal acid generator is preferably a compound that generates an acid at 100° C. to 180° C. (more preferably, 120° C. to 180° C., and still more preferably 120° C. to 160° C.). By setting the acid generation temperature to 100° C. or more, it is possible to ensure the temporal stability of the resin composition for underlayer film formation.

Examples of the thermal acid generator include isopropyl-p-toluenesulfonate, cyclohexyl-p-toluenesulfonate, and an aromatic sulfonium salt compound named SAN-AID SI series manufactured by Sanshin Chemical Industry Co., Ltd.

In the case of blending an acid and/or a thermal acid generator, the acid and/or the thermal acid generator is contained in an amount of preferably 0.1 to 10 mass %, and more preferably 0.5 to 5 mass %, with respect to the resin.

The content of the acid and/or the thermal acid generator is preferably 0.0005 to 0.1 mass %, more preferably 0.0005 to 0.01 mass %, and still more preferably 0.0005 to 0.005 mass %, based on the total amount of the resin composition for underlayer film formation.

In the present invention, the acid and the thermal acid generator may be used in combination thereof or may be respectively used alone. In addition, acids and thermal acid generators may be respectively used alone or in combination of two or more thereof.

The resin composition for underlayer film formation according to the present invention preferably contains 0.05 to 1.0 mass % of the above-mentioned resin, 98.0 to 99.95 mass % of a solvent, and 0.0005 to 0.1 mass % of an acid and/or a thermal acid generator, more preferably 0.05 to 0.5 mass % of the above-mentioned resin, 99.5 to 99.95 mass % of a solvent, and 0.0005 to 0.01 mass % of an acid and/or an acid generator, and particularly preferably 0.05 to 0.3 mass % of the above-mentioned resin, 99.70 to 99.95 mass % of a solvent, and 0.0005 to 0.005 mass % of an acid and/or an acid generator.

<<Other Components>>

The resin composition for underlayer film formation according to the present invention may contain a crosslinking agent, a polymerization inhibitor, and a surfactant, as other components. The amount of these components to be blended is preferably 50 mass % or less, more preferably 30 mass % or less, and still more preferably 10 mass % or less, with respect to the total components of the resin composition for underlayer film formation excluding the solvent. It is, however, particularly preferable to contain substantially no other components. The expression of "to contain substantially no other components" as used herein means that the other components are not intentionally added to the resin composition for underlayer film formation, except for, for example, additives such as a reactant, a catalyst and a polymerization inhibitor used for synthesis of the resin, and impurities derived from reaction by-products. More specifically, the content of the other components may be 5 mass % or less, and further 1 mass % or less.

<<<Crosslinking Agent>>>

The crosslinking agent is preferably a cation-polymerizable compound such as an epoxy compound, an oxetane compound, a methylol compound, a methylol ether compound, or a vinyl ether compound.

Examples of the epoxy compound include EPOLITE manufactured by Kyoeisha Chemical Co., Ltd.; DENACOL EX manufactured by Nagase chemteX Corporation; EOCN, EPPN, NC, BREN, GAN, GOT, AK, and RE Series manufactured by Nippon Kayaku Co., Ltd.; EPIKOTE manufactured by Japan Epoxy Resins Co., Ltd.; EPICLON manufactured by DIC Corporation; and TEPIC Series manufactured by Nissan Chemical Industries, Ltd. Two or more thereof may be used in combination.

Examples of the oxetane compound include ETERNA-COLL OXBP, OXTP, and OXIPA manufactured by Ube Industries, Ltd.; and ARON oxetane OXT-121 and OXT-221 manufactured by Toagosei Co., Ltd.

Examples of the vinyl ether compound include VEctomer Series manufactured by Allied Signal, Inc.

Examples of the methylol compound and methylol ether compound include a urea resin, a glycouril resin, a melamine resin, a guanamine resin, and a phenol resin. Specific examples thereof include NIKALAC MX-270, MX-280, MX-290, MW-390, and BX-4000 manufactured by Sanwa Chemical Co., Ltd; and CYMEL 301, 303 ULF, 350, and 1123 manufactured by Cytec Industries Inc.

<<<Polymerization Inhibitor>>>

The preservation stability can be improved by including a polymerization inhibitor in a resin composition for underlayer film formation. Examples of the polymerization inhibitor include hydroquinone, p-methoxyphenol, di-tert-butyl-p-cresol, pyrogallol, tert-butylcatechol, benzoquinone, 4,4'-thiobis(3-methyl-6-tert-butylphenol), 2,2'-methylenebis(4-methyl-6-tert-butylphenol), N-nitrosophenylhydroxylamine cerous salt, phenothiazine, phenoxazine, 4-methoxynaphthol, 2,2,6,6-tetramethylpiperidine-1-oxyl free radical, 2,2,6,6-tetramethylpiperidine, 4-hydroxy-2,2,6,6-tetramethylpiperidine-1-oxyl free radical, nitrobenzene, and dimethylaniline. Among them, phenothiazine, 4-methoxynaphthol, 2,2,6,6-tetramethylpiperidine-1-oxyl free radical, 2,2,6,6-tetramethylpiperidine, and 4-hydroxy-2,2,6,6-tetramethylpiperidine-1-oxyl free radical are preferable, since they exhibit polymerization inhibiting effects even under an oxygen-free condition.

<<<Surfactant>>>

The resin composition for underlayer film formation may contain a surfactant. The surfactant is preferably a nonionic surfactant. The nonionic surfactant is preferably a fluorine-based surfactant, a Si-based surfactant, or a fluorine/Si-based surfactant. As used herein, the term "fluorine/Si-based surfactant" refers to a surfactant satisfying both the requirement of a fluorine-based surfactant and that of a Si-based surfactant surfactant. By using such a surfactant, uniformity of coating may be improved, and a good coated film may be obtained by coating using a spin coater or slit scan coater.

Examples of commercially available nonionic surfactants include various series under the trade names of FLUORAD (from Sumitomo 3M Ltd.), MEGAFACE (from DIC Corporation), SURFLON (from AGC Seimi Chemical Co., Ltd.), UNIDYNE (from Daikin Industries, Ltd.), FTERGENT (from NEOS Co., Ltd.), EFTOP (from Mitsubishi Materials Electronic Chemicals Co., Ltd.), POLYFLOW (from Kyoeisha Chemical Co., Ltd.), KP (from Shin-Etsu Chemical Co., Ltd.), TROYSOL (from Troy Chemical Industries), PolyFox (from OMNOVA Solutions Inc.), and Capstone (from DuPont).

<Preparation of Resin Composition for Underlayer Film Formation>

The resin composition for underlayer film formation according to the present invention may be prepared by mixing the individual components described above. After mixing of the individual components, for example, the mixture is preferably filtered through a filter with a pore size of 0.003 to 5.0 µm. The filtration may be conducted in a multi-step manner or may be repeated plural times. The material for a filter used in filtration include a polyethylene resin, a polypropylene resin, a fluororesin, and a nylon resin, but is not particularly limited thereto.

The resin composition for underlayer film formation according to the present invention preferably contains 0.1 to 5 mass % of the above-mentioned resin and 95.0 to 99.9 mass % of a solvent, more preferably 0.05 to 1.0 mass % of the above-mentioned resin, 98.0 to 99.95 mass % of a solvent, and 0.0005 to 0.1 mass % of an acid and/or a thermal acid generator, still more preferably 0.05 to 0.5 mass % of the above-mentioned resin, 99.5 to 99.95 mass % of a solvent, and 0.0005 to 0.01 mass % of an acid and/or an acid generator, and particularly preferably 0.05 to 0.3 mass % of the above-mentioned resin, 99.70 to 99.95 mass % of a solvent, and 0.0005 to 0.005 mass % of an acid and/or an acid generator. If the above-specified composition is satisfied, an underlayer film having excellent surface flatness and adhesiveness is easily obtained.

<Photocurable Composition>

The photocurable composition (preferably, a photocurable composition for imprints) used together with the resin composition for underlayer film formation according to the present invention generally contains a polymerizable compound and a photopolymerization initiator.

<<Polymerizable Compound>>

The polymerizable compound is preferably a polymerizable monomer. Examples thereof include a polymerizable monomer having 1 to 6 groups containing an ethylenically unsaturated bond; an epoxy compound; an oxetane compound; a vinyl ether compound; a styrene derivative; and propenyl ether and butenyl ether.

The polymerizable compound preferably has a polymerizable group which is polymerizable with the polymerizable group of the resin contained in the resin composition for underlayer film formation according to the present invention. Among them, (meth)acrylate is preferable. Specific examples thereof include those described in paragraphs "0020" to "0098" of JP2011-231308A, the content of which is incorporated herein by reference in its entirety.

The content of the polymerizable compound is, for example, preferably 50 to 99 mass %, more preferably 60 to 99 mass %, and still more preferably 70 to 99 mass %, with respect to the total solid content of the photocurable composition. In the case where two or more polymerizable compounds are used, it is preferred that the total amount thereof is within the above-specified range.

The polymerizable compound is preferably a polymerizable compound having an alicyclic hydrocarbon group and/or an aromatic group, and preferably contains a polymerizable compound having an alicyclic hydrocarbon group and/or an aromatic group, and a polymerizable compound having a silicon atom and/or a fluorine atom. The total content of the polymerizable compounds having an alicyclic hydrocarbon group and/or an aromatic group preferably accounts for 30 to 100 mass %, more preferably 50 to 100 mass %, and still more preferably 70 to 100 mass % of the total polymerizable compounds. The molecular weight of the polymerizable compound is preferably of less than 1000.

In a further preferable aspect, a (meth)acrylate polymerizable compound having an aromatic group, used as the polymerizable compound, preferably accounts for 50 to 100 mass %, more preferably 70 to 100 mass %, and particularly preferably 90 to 100 mass % of the total polymerizable compounds.

In a particularly preferable aspect, a polymerizable compound (1) described below accounts for 0 to 80 mass % (more preferably 20 to 70 mass %) of the total polymerizable compounds, a polymerizable compound (2) described below accounts for 20 to 100 mass % (more preferably 50 to 100 mass %) of the total polymerizable compounds, and a polymerizable compound (3) described below accounts for 0 to 10 mass % (more preferably 0.1 to 6 mass %) of the total polymerizable compounds:

(1) a polymerizable compound having an aromatic group (preferably a phenyl group or a naphthyl group, and more preferably a naphthyl group) and a (meth)acryloyloxy group;

(2) a polymerizable compound having an aromatic group (preferably a phenyl group or a naphthyl group, and more preferably a phenyl group), and two (meth)acrylate groups; and (3) a polymerizable compound having at least one of a fluorine atom or a silicon atom (more preferably a fluorine atom), and a (meth)acryloyloxy group.

In a photocurable composition for imprints, the content of a polymerizable compound having a viscosity at 25° C. of less than 5 mPa·s is preferably 50 mass % or less, more preferably 30 mass % or less, and still more preferably 10 mass % or less, with respect to the total polymerizable compounds. By setting the content of a polymerizable compound to the above-specified range, inkjet ejection stability may be improved, and thereby defects in imprint transfer may be reduced.

<<Photopolymerization Initiator>>

The photopolymerization initiator may be any compound which generates an active species capable of polymerizing the above-described polymerizable compound under photoirradiation. The photopolymerization initiator is preferably a radical polymerization initiator or a cation polymerization initiator, and more preferably a radical polymerization initiator. In the present invention, a plurality of photopolymerization initiators may be used in combination.

The radical photopolymerization initiator may be, for example, commercially available initiators. Those described, for example, in paragraph "0091" of JP2008-105414A may be preferably used. Among them, an acetophenone-based compound, an acylphosphine oxide-based compound, and an oxime ester-based compound are preferable from the viewpoints of curing sensitivity and absorption properties. Examples of commercially available products include Irgacure (registered trademark) 907 (manufactured by BASF GmbH).

The content of the photopolymerization initiator is, for example, preferably 0.01 to 15 mass %, more preferably 0.1 to 12 mass %, and still more preferably 0.2 to 7 mass %, with respect to the total solid content of the photocurable composition. In the case where two or more photopolymerization initiators are used, the total content thereof preferably falls in the above-specified ranges. In the case where the content of the photopolymerization initiator is 0.01 mass % or more, there will be preferable trends of improvements in sensitivity (fast curability), resolution, line edge roughness, and coating film strength. On the other hand, in the case where the content of the photopolymerization initiator is 15 mass % or less, there will be preferable trends of improvements in light transmittance, colorability, and handleability.

<<Surfactant>>

The photocurable composition preferably contains a surfactant.

The surfactant may be, for example, those surfactants described for the resin composition for underlayer film formation as described above. Examples of the surfactant usable in the present invention may be referred to paragraph "0097" of JP2008-105414A, the content of which is incorporated herein by reference in its entirety. The surfactant is also commercially available, and an example thereof includes PF-636 (manufactured by OMNOVA Solutions Inc.).

The content of the surfactant is, for example, 0.001 to 5 mass %, preferably 0.002 to 4 mass %, and still more preferably 0.005 to 3 mass %, with respect to the total solid content of the photocurable composition. In the case where two or more surfactants are used, the total content thereof preferably falls in the above-specified ranges. If the content of the surfactant falls in the range from 0.001 to 5 mass % of the composition, an effect on uniformity of coating will be good.

<<Non-Polymerizable Compound>>

The photocurable composition may contain a non-polymerizable compound which has, at the terminal thereof, at least one hydroxyl group or a polyalkylene glycol structure formed by etherifying the hydroxyl group, and contains substantially no fluorine atom and silicon atom.

The content of the non-polymerizable compound is, for example, preferably 0.1 to 20 mass %, more preferably 0.2 to 10 mass %, still more preferably 0.5 to 5 mass %, and even more preferably 0.5 to 3 mass %, with respect to the total solid content of the photocurable composition.

<<Antioxidant>>

The photocurable composition preferably contains an antioxidant.

The antioxidant is for preventing fading by heat or photoirradiation, and for preventing fading by various oxidized gases such as ozone, active hydrogen, $NO_x$, and $SO_x$ (x is an integer). Incorporation of an antioxidant into the photocurable composition brings about advantages that the cured film is prevented from being discolored and the film thickness is prevented from being reduced due to decomposition of the cured film.

Examples of the antioxidant includes hydrazides, hindered amine-based antioxidants, nitrogen-containing heterocyclic mercapto-based compounds, thioether-based antioxidants, hindered phenol-based antioxidants, ascorbic acids, zinc sulfate, thiocyanates, thiourea derivatives, saccharides, nitrites, sulfites, thiosulfates, and hydroxylamine derivatives. Among these, particularly preferred are hindered phenol-based antioxidants and thioether-based antioxidants from the viewpoint of their effect of preventing cured film discoloration and preventing film thickness reduction.

Commercial products of the antioxidant include trade name Irganox (registered trademark) 1010, 1035, 1076, and 1222 (all manufactured by BASF GmbH); trade name Antigene P, 3C, FR, SUMILIZER S, and SUMILIZER GA80 (manufactured by Sumitomo Chemical Co., Ltd.), and trade name ADEKASTAB AO70, AO80, and AO503 (manufactured by Adeka). These antioxidants may be used alone or in combination thereof.

The content of the antioxidant is, for example, 0.01 to 10 mass %, and preferably 0.2 to 5 mass %, with respect to the polymerizable compound. In the case where two or more antioxidants are used, the total amount thereof preferably falls within the above-specified range.

<<Polymerization Inhibitor>>

The photocurable composition preferably contains a polymerization inhibitor. By including the polymerization inhibitor, there is a tendency capable of suppressing a change in viscosity over time, occurrence of foreign materials and deterioration of pattern formability.

The content of the polymerization inhibitor is, for example, 0.001 to 1 mass %, preferably 0.005 to 0.5 mass %, and more preferably 0.008 to 0.05 mass %, with respect to the polymerizable compound, and a change in viscosity over time can be inhibited while maintaining a high curing sensitivity by blending the polymerization inhibitor in an appropriate amount. The polymerization inhibitor may be contained in the polymerizable compound to be used in advance or may be further added to the photocurable composition.

Specific examples of the polymerization inhibitor may be referred to the description in paragraph "0125" of JP2012-094821A, the content of which is incorporated herein by reference in its entirety.

<<Solvent>>

The photocurable composition may contain a solvent, if necessary. A preferred solvent is a solvent having a boiling point of 80° C. to 200° C. at normal pressures. Regarding the type of the solvent, any solvent capable of dissolving individual components may be used, and examples thereof include the same solvents as those described for the above-mentioned resin composition for underlayer film formation. Among them, most preferred is a solvent containing propylene glycol monomethyl ether acetate from the viewpoint of coating uniformity.

The content of the solvent in the photocurable composition is optimally adjusted depending on the viscosity, coatability, and desired film thickness of the photocurable composition. From the viewpoint of improving coatability, the content of the solvent in the photocurable composition may be preferably in the range of 99 mass % or less. In the case where the photocurable composition is applied onto a base material by an inkjet method, it is preferred that the photocurable composition contains substantially no solvent (for example, 3 mass % or less). On the other hand, when a pattern having a film thickness of 500 nm or less is formed by a spin-coating method or the like, the content of the solvent may be 20 to 99 mass %, preferably 40 to 99 mass %, and particularly preferably 70 to 98 mass %.

<<Polymer Component>>

The photocurable composition may further contain a polymer component, from the viewpoint of improving dry etching resistance, imprint suitability, curability, and the like. The polymer component is preferably a polymer having a polymerizable functional group in the side chain thereof. The mass average molecular weight of the polymer component is preferably 2000 to 100000, and more preferably 5000 to 50000, from the viewpoint of compatibility with a polymerizable compound. The content of the polymer component is preferably 0 to 30 mass %, more preferably 0 to 20 mass %, still more preferably 0 to 10 mass %, and most preferably 0 to 2 mass %, with respect to the total solid content of the photocurable composition.

In a photocurable composition for imprints, since pattern formability may be improved if the content of a compound having a molecular weight of 2000 or larger is 30 mass % or less, a lower content of polymer component is preferable, and therefore it is preferred that the photocurable composition contains substantially no polymer component, except for a surfactant or trace amounts of additives.

In addition to the above-mentioned components, the photocurable composition may contain a mold release agent, a silane coupling agent, an ultraviolet absorber, a light stabilizer, an antiaging agent, a plasticizer, an adhesion promoter, a thermal polymerization initiator, a colorant, elastomer particles, a photoacid amplifier, a photobase generator, a basic compound, a fluidity controlling agent, an anti-foaming agent, or a dispersant, if desired.

The photocurable composition may be prepared by mixing the individual components described above. Mixing of the individual components is generally carried out in a temperature range of 0° C. to 100° C. After mixing of the individual components, for example, the mixture is preferably filtered through a filter having a pore size of 0.003 to 5.0 μm. The filtration may be carried out in a multi-stage manner, or may be repeated a plurality of times. The filtrate may be re-filtered. The material for a filter used in filtration may be a polyethylene resin, a polypropylene resin, a fluororesin, a nylon resin, or the like, but is not particularly limited.

In the photocurable composition, a mixture of the total components excluding a solvent preferably has a viscosity of 100 mPa·s or smaller, more preferably 1 to 70 mPa·s, still more preferably 2 to 50 mPa·s, and most preferably 3 to 30 mPa·s.

The photocurable composition after manufacturing thereof is bottled in a container such as a gallon bottle or a coated bottle, and transported or stored. In this case, the inner space of the container may be replaced with an inert gas such as nitrogen or argon, for the purpose of preventing deterioration. While the photocurable composition may be transported or stored at normal temperature, it is also preferable to control the temperature in the range from −20° C. to 0° C. for the purpose of preventing denaturation. Of course, the photocurable composition may be shielded from light up to a level of suppressing the reaction from proceeding.

A permanent film (a resist for structural members) for use in a liquid-crystal display (LCD) or the like and a resist for use in substrate processing for electronic materials are strongly required to avoid contamination by metallic or organic ionic impurities, in order that operations of the product will not be interfered. In the case where the photocurable composition is used for such an application, the concentration of the metallic or organic ionic impurities in the photocurable composition is preferably 1 ppm or less, more preferably 100 ppb or less, and still more preferably 10 ppb or less.

<Layered Product>

The layered product of the present invention has, on the surface of a base material, an underlayer film formed by curing the above-mentioned resin composition for underlayer film formation according to the present invention.

The thickness of the underlayer film is not particularly limited, but it is preferably 1 to 10 nm, and more preferably 2 to 5 nm.

The base material is not particularly limited and is selectable depending on a variety of applications. Examples of the base material include quartz, glass, an optical film, a ceramic material, an evaporated film, a magnetic film, a reflective film, a metal substrate such as a Ni, Cu, Cr or Fe substrate, a paper, Spin On Carbon (SOC), Spin On Glass (SOG), a polymer substrate such as a polyester film, a polycarbonate film or a polyimide film, a thin film transistor (TFT) array substrate, an electrode plate of plasma display panel (PDP), a conductive substrate such as an Indium Tin Oxide (ITO) or metal substrate, an insulating substrate, and a substrate used in semiconductor manufacturing such as silicon, silicon nitride, polysilicon, silicon oxide or amorphous silicon. In the present invention, an appropriate underlayer film may be formed particularly even when a substrate having a small surface energy (for example, about 40 to 60 mJ/m$^2$) is used. Meanwhile, in the case where the base material is intended to be etched, a substrate used in semiconductor manufacturing is preferable.

In the present invention, in particular, a base material having a polar group on the surface thereof may be preferably used. By using the base material having a polar group on the surface thereof, there is a tendency of further improvements in adhesiveness to a resin composition for underlayer film formation. Examples of the polar group include a hydroxyl group, a carboxyl group, and a silanol group. A silicon substrate and a quartz substrate are particularly preferable.

The geometry of the substrate is also not particularly limited, and may be plate-shaped or roll-shaped. The substrate is also selectable from those of light transmissive and non-light transmissive types, depending on combination with a mold, or the like.

A pattern formed of the above-mentioned photocurable composition may be formed on the surface of the underlayer film. The pattern may be used, for example, as an etching resist. The base material in this case is exemplified by a substrate (silicon wafer) having a thin film of Spin On Carbon (SOC), Spin On Glass (SOG), $SiO_2$, or silicon nitride formed thereon. Multiple etching onto a base material may be carried out at the same time.

The layered product having a pattern formed thereon may be used as a permanent film in devices or structures, in an intact form, or in a form obtained after removing any residual film in recessed portions or removing the underlayer film. Such a layered product is less causative of film separation and is therefore useful, even under environmental changes or stress applied thereto.

<Method for Forming Pattern>

Next, the method for forming a pattern according to the present invention will be described.

The method for forming a pattern according to the present invention includes a step of applying the resin composition for underlayer film formation according to the present invention onto the surface of a base material; a step of heating the applied resin composition for underlayer film formation to form an underlayer film; a step of applying a photocurable composition onto the surface of the underlayer film; a step of pressing thereto a mold with a pattern; a step of curing the photocurable composition by photoirradiation, while keeping it pressed under the mold; and separating the mold. In particular, in the present invention, the step of forming an underlayer film is capable of forming an underlayer film having high adhesiveness to a cured film (an imprint layer, or the like) of a photocurable composition, and excellent surface flatness, even when a baking temperature is low (for example, 120° C. to 160° C.).

FIG. 1 is a schematic view illustrating an example of a manufacturing process when a photocurable composition for imprints is used for etching of a base material, in which reference numeral 1 stands for a base material, 2 stands for an underlayer film, 3 stands for an imprint layer, and 4 stands for a mold. In FIG. 1, a resin composition for underlayer film formation is applied onto the surface of the base material 1 (2), the photocurable composition for imprints is applied onto the surface (3), and the mold is applied onto the surface thereof (4). After photoirradiation is carried out, the mold is separated (5). Etching is carried out according to a pattern (an imprint layer 3) formed by the photocurable composition for imprints (6), and the imprint layer 3 and the underlayer film 2 are separated to thereby form a base material with a desired pattern formed thereon (7). The adhesiveness between the base material 1 and the imprint layer 3 is important, since a poor level of the adhesiveness results in failing to exactly transfer the pattern of the mold 4.

Hereinafter, details of the method for forming a pattern according to the present invention will be described.

<<Step of Applying Resin Composition for Underlayer Film Formation>>

First, a resin composition for underlayer film formation is applied onto the surface of a base material. The method of applying a resin composition for underlayer film formation is preferably a coating method. Examples of the coating method include dip coating, air knife coating, curtain coating, wire bar coating, gravure coating, extrusion coating, spin coating, slit scan coating, and inkjet coating. Spin coating is preferable from the viewpoint of film thickness uniformity.

The coating amount of the resin composition for underlayer film formation is, for example, preferably 1 to 10 nm, and more preferably 3 to 8 nm in terms of film thickness after curing.

<<Step of Forming Underlayer Film>>

Next, the resin composition for underlayer film formation applied onto the base material surface is heated to form an underlayer film.

The resin composition for underlayer film formation applied onto the base material surface is preferably dried to remove a solvent. A preferred drying temperature is 70° C. to 130° C.

After carrying out a drying step if necessary, the resin composition for underlayer film formation is heated and cured to form an underlayer film. Regarding the heating conditions, it is preferred that the heating temperature (baking temperature) is 120° C. to 250° C., and the heating time is 30 seconds to 10 minutes.

In the case where the resin composition for underlayer film formation contains substantially no acid and thermal acid generator, the baking temperature is more preferably 160° C. to 250° C., and still more preferably 180° C. to 250° C.

In the case where the resin composition for underlayer film formation contains an acid or a thermal acid generator, the baking temperature is more preferably 120° C. to 180° C., and still more preferably 120° C. to 160° C.

The step of removing a solvent and the curing step may be carried out at the same time.

In the present invention, it is preferred that the resin composition for underlayer film formation is applied onto the base material surface, followed by heating to cure at least a portion of the resin composition for underlayer film formation, and then a photocurable composition is applied onto the surface of the underlayer film. When such means is adopted, the resin composition for underlayer film formation is also completely cured at the time of photocuring the photocurable composition, whereby there is a tendency that adhesiveness is further improved.

<<Step of Applying Photocurable Composition>>

Next, a photocurable composition is applied onto the surface of the underlayer film. The method of applying a photocurable composition may employ the same method as the above-mentioned application method of a resin composition for underlayer film formation.

The film thickness of the patterning layer composed of the photocurable composition may vary depending on purpose of use. For example, the film thickness after drying is preferably about 0.03 to 30 μm. The photocurable composition may be applied by multiple applications. In a method of placing liquid droplets on the underlayer film by an inkjet method or the like, the volume of liquid droplets is preferably 1 pl to 20 pl. The liquid droplets are preferably arranged on the underlayer film while keeping a space therebetween.

<<Step of Pressing Mold>>

Next, a mold is pressed against the surface of the patterning layer for transferring the pattern from the mold onto the patterning layer. Accordingly, the fine pattern previously formed on the pressing surface of the mold can be transferred onto the patterning layer.

Alternatively, the photocurable composition may be applied over the mold having a pattern formed thereon, and the underlayer film may be pressed thereto.

When the mold is pressed against the patterning layer surface, helium may be introduced between the mold and the patterning layer surface. By using such a method, the permeation of gases through the mold is promoted, so it is possible to facilitate the elimination of residual air bubbles. Further, it is possible to suppress radical polymerization inhibition in the exposure by reducing the dissolved oxygen in the patterning layer. Alternatively, a condensable gas instead of helium may be introduced between the mold and the patterning layer. By using such a method, it is possible to further accelerate the disappearance of residual air bubbles by utilizing the fact that the introduced condensable gas is condensed to result in a decrease of the volume thereof. The condensable gas refers to a gas which is condensed by temperature and pressure, and for example, trichlorofluoromethane, 1,1,1,3,3-pentafluoropropane, or the like may be used. The condensable gas may be referred to, for example, the description of paragraph "0023" of JP2004-103817A and paragraph "0003" of JP2013-254783A, the contents of which are incorporated herein by reference in their entirety.

A mold material is described. In photo-nanoimprint lithography using a photocurable composition, a light transmissive material is selected for at least one of a mold material and/or a base material. In the photo-nanoimprint lithography applied to the present invention, the photocurable composition is applied onto a base material to form a patterning layer thereon, and a light transmissive mold is pressed against the surface of the layer which is then irradiated with light from the back of the mold to thereby cure the patterning layer. Alternatively, the photocurable composition is applied onto a light transmissive base material, and a mold is pressed thereagainst, followed by irradiation with light from the back of the base material whereby the photocurable composition can be cured.

The photoirradiation may be carried out while the mold is kept in contact with the patterning layer or after the mold is separated. In the present invention, the photoirradiation is preferably carried out while the mold is kept in contact with the patterning layer.

The mold usable in the present invention has a pattern to be transferred. The pattern on the mold may be formed with a desired level of processing accuracy, for example, by photolithography, electron beam lithography, or the like. The method of forming a pattern on the mold is not particularly limited in the present invention. Also a pattern formed by the method for forming a pattern according to the present invention may be used as a mold.

The light transmissive mold material for use in the present invention is not particularly limited and may be any one having a predetermined strength and durability. Specific examples of the light transmissive mold material include glass, quartz, a light-transparent resin such as an acrylic resin or a polycarbonate resin, a transparent evaporated metal film, a flexible film of polydimethylsiloxane or the like, a photocured film, and a metal film.

The material for a non-light transmissive mold to be used in the case where a light transmissive base material is used is not particularly limited and may be any one having a predetermined strength. Specific examples of the non-light transmissive mold material include, but are not particularly limited to, a ceramic material, an evaporated film, a magnetic film, a reflective film, a metal substrate of Ni, Cu, Cr, Fe, or the like, SiC, silicon, silicon nitride, polysilicon, silicon oxide, and amorphous silicon. The shape of the mold is not also particularly limited, and may be any of a plate-shaped mold or a roll-shaped mold. The roll-shaped mold is applied especially when continuous transfer in patterning is desired.

The mold for use in the present invention may be subjected to a surface release treatment for the purpose of enhancing the releasability of the photocurable composition from the mold. The mold of such a type includes those surface-treated with a silicon-based or fluorine-based silane coupling agent, for which, for example, commercially available mold release agents such as OPTOOL DSX manufactured by Daikin Industries, Ltd., and Novec ECSC-1720 manufactured by Sumitomo 3M Ltd. may be suitably used.

In the case where photo-nanoimprint lithography is carried out using the photocurable composition, the mold pressure in the method for forming a pattern according to the present invention is preferably 10 atmospheres or lower. When the mold pressure is 10 atmospheres or lower, then the mold and the base material are hardly deformed and the patterning accuracy tends to increase. It is also preferable since there is a tendency that the apparatus may be small-sized because the pressure to be given to the mold is low. The mold pressure is preferably selected from the region capable of securing the mold transfer uniformity, within a range by which the residual film of the photocurable composition for imprints in the area of mold pattern projections may be reduced.

<<Step of Curing Photocurable Composition>>

Then, the photocurable composition is cured by photoirradiation in a state where the mold is the pressed against the patterning layer. The dose of photoirradiation may be sufficiently larger than the dose necessary for curing of the photocurable composition. The dose necessary for curing may be suitably determined depending on the degree of consumption of the unsaturated bonds in the photocurable composition and on the tackiness of the cured film as previously determined.

In the photo-nanoimprint lithography applied to the present invention, photoirradiation is carried out while keeping the substrate temperature generally at room temperature, where the photoirradiation may alternatively be carried out under heating for the purpose of enhancing the reactivity. Photoirradiation can also be carried out in vacuo, since a vacuum conditioning prior to the photoirradiation is effective for preventing entrainment of air bubbles, for suppressing the reactivity from being reduced due to incorporation of oxygen, and for improving the adhesiveness between the mold and the photocurable composition. In the method for forming a pattern according to the present invention, the degree of vacuum in the process of photoirradiation is preferably in the range from $10^{-1}$ Pa to normal pressure.

The light to be used for curing the photocurable composition is not particularly limited, and examples thereof include light and radiations with a wavelength falling within a range of high-energy ionizing radiation, near-ultraviolet, far-ultraviolet, visible, infrared, and the like. The high-energy ionizing radiation source includes, for example, accelerators such as COCKCROFT accelerator, VAN DE GRAAFF accelerator, linear accelerator, betatron, and cyclotron. The electron beams accelerated by such an accelerator are used most industrially conveniently and most economically; but any other radioisotopes and other radiations from nuclear reactors, such as γ-rays, X-rays, α-rays, neutron beams, and proton beams may also be used. The UV sources include, for example, UV fluorescent lamp, low-pressure mercury lamp, high pressure mercury lamp, ultrahigh pressure mercury lamp, xenon lamp, carbon arc lamp, and solar lamp. The radiations include, for example, microwaves, and EUV. In addition, laser light for use in microfabrication of semiconductors, such as LED, semiconductor laser light, 248 nm KrF excimer laser light, and 193 nm ArF excimer laser light, is also favorably used in the present invention. These lights may be monochromatic lights, or may also be lights of different wavelengths (mixed light).

When the exposure is carried out, the light intensity is desired to be within the range of 1 to 50 $mW/cm^2$. When the light intensity is 1 $mW/cm^2$ or more, then the producibility may increase since the exposure time may be reduced; and when the light intensity is 50 $mW/cm^2$ or less, then it is preferable since there is a tendency that the properties of the permanent film formed may be prevented from being degraded owing to side reaction. The exposure dose is desired to be within the range of 5 to 1000 $mJ/cm^2$. When the exposure dose is within such a range, curability of the photocurable composition is favorable. Further, when the exposure is carried out, the oxygen concentration in the atmosphere may be controlled to be less than 100 mg/L by introducing an inert gas such as nitrogen or argon into the system for preventing the radical polymerization from being inhibited by oxygen.

In the present invention, after the patterning layer (a layer composed of the photocurable composition) is cured through photoirradiation, if desired, the cured pattern may be further cured under heat given thereto. The heating temperature is, for example, preferably 150° C. to 280° C., and more preferably 200° C. to 250° C. The heating time is, for example, preferably 5 to 60 minutes, and more preferably 15 to 45 minutes.

<<Step of Separating Mold>>

A pattern according to the shape of a mold can be formed by curing the photocurable composition as described above, and then separating the mold.

Since the resin composition for underlayer film formation according to the present invention exhibits excellent adhesiveness to the patterning layer, it is possible to suppress separation of the patterning layer at the time of separating the mold. Further, a surface flatness of the underlayer film is satisfactory, and the surface flatness of the patterning layer is also favorable.

Specific examples of the method for forming a pattern include the methods described in paragraphs "0125" to "0136" of JP2012-169462A, the content of which is incorporated herein by reference in its entirety.

Further, the method for forming a pattern according to the present invention can be applied to a pattern reversal method. The pattern reversal method is carried out as follows. Specifically, a resist pattern is formed on a base material such as a carbon film (SOC) by the method for forming a pattern according to the present invention. Subsequently, the resist pattern is coated with such a Si-containing film (SOG), an upper portion of the Si-containing film is subjected to etching back such that the resist pattern is exposed, and then the exposed resist pattern is removed by oxygen plasma or the like, whereby it is possible to form a reversal pattern of the Si-containing film. Further, using the reversal pattern of the Si-containing film as an etching mask, the base material thereunder is etched whereby the reversal pattern is transferred onto the base material. Finally, using the base material having the reversal pattern transferred thereon as an etching mask, the base material is etching-processed. Examples of such a method can be referred to JP1993-267253A (JP-H05-267253A), JP2002-110510A, and paragraphs "0016" to "0030" of JP2006-521702A, the contents of which are incorporated herein by reference in their entirety.

<Process for Producing Device>

The process for producing a device according to the present invention includes the above-mentioned method for forming a pattern.

That is, a device can be produced by forming a pattern using the above-mentioned method and then applying the method used in the production of various devices.

The pattern may be included as a permanent film in the device. Also, using the pattern as an etching mask, the base material may also be subjected to an etching process. For example, the base material is subjected to dry etching using the pattern as an etching mask to thereby selectively remove the upper layer portion of the base material. The base material is repeatedly subjected to such processing, whereby it is possible to manufacture a device. The device may be, for example, a semiconductor device such as a large-scale integrated circuit (LSI).

EXAMPLES

Hereinafter, this invention will be described in more detail with reference to Examples. Materials, amounts to be used, ratios, details of processes, and procedures of processes described in the following Examples may be modified suitably, without departing from the spirit of this invention. Therefore, the scope of this invention is not limited thereto. The expressions "parts" and "%" are based on mass unless otherwise specified.

<Synthesis of Resin A-3>

Propylene glycol monomethyl ether acetate (PGMEA) (28.5 g) was charged into a flask which was then warmed to 90° C. under a nitrogen atmosphere. To the solution was added dropwise a mixture of glycidyl methacrylate (GMA, manufactured by Wako Pure Chemical Industries, Ltd.) (14.2 g), 1-ethylcyclopentylmethacrylate (EtCPMA, manufactured by Osaka Organic Chemical Industry Ltd.) (18.2 g), 2,2'-azobis(methyl 2-methylpropanoate) (V-601, manufactured by Wako Pure Chemical Industries, Ltd.) (1.1 g), and PGMEA (28.5 g) over 4 hours. After completion of the dropwise addition, the reaction mixture was further stirred at 90° C. for 4 hours to obtain a PGMEA solution of the GMA polymer.

To the solution of the GMA polymer were added acrylic acid (AA, manufactured by Wako Pure Chemical Industries, Ltd.) (15.0 g), tetrabutylammonium bromide (TBAB, manufactured by Wako Pure Chemical Industries, Ltd.) (2.0 g), and 4-hydroxy-2,2,6,6-tetramethylpiperidine 1-oxyl free radicals (4-HO-TEMPO, manufactured by Wako Pure Chemical Industries, Ltd.) (50 mg), followed by reaction at 90° C. for 10 hours. After the completion of the reaction, 200 mL of ethyl acetate was added thereto, followed by separatory extraction with aqueous sodium bicarbonate and then dilute aqueous hydrochloric acid to remove excess acrylic acid and TBAB of the catalyst. Finally, the extract was washed with pure water. This was followed by concentration under reduced pressure and distilling of ethyl acetate. The resulting resin A-3 had a mass average molecular weight of 15100 and a dispersity (mass average molecular weight/number average molecular weight) of 1.8.

<Synthesis of Resin A-1>

Resin A-1 was synthesized in the same manner as in Synthesis Example of resin A-3, except that 25.6 g of GMA and 3.6 g of EtCPMA were used. The resulting resin A-1 had a mass average molecular weight of 20300 and a dispersity (mass average molecular weight/number average molecular weight) of 2.0.

<Synthesis of Resin A-2>

Resin A-2 was synthesized in the same manner as in Synthesis Example of resin A-3, except that 19.9 g of GMA and 10.9 g of EtCPMA were used. The resulting resin A-2 had a mass average molecular weight of 17800 and a dispersity (mass average molecular weight/number average molecular weight) of 1.9.

<Synthesis of Resin A-4>

Resin A-4 was synthesized in the same manner as in Synthesis Example of resin A-3, except that 8.5 g of GMA and 25.5 g of EtCPMA were used. The resulting resin A-4 had a mass average molecular weight of 13500 and a dispersity (mass average molecular weight/number average molecular weight) of 1.8.

<Synthesis of Resin A-5>

Resin A-5 was synthesized in the same manner as in Synthesis Example of resin A-3, except that 2.8 g of GMA and 32.8 g of EtCPMA were used. The resulting resin A-5 had a mass average molecular weight of 12000 and a dispersity (mass average molecular weight/number average molecular weight) of 1.8.

<Synthesis of Resins A-6 to A-10>

Resins A-6 to A-10 were synthesized by changing the monomers in Synthesis Example of resin A-3.

The structures of the resins used in the present invention are shown below. x and y represent the molar ratio of each repeating unit.

TABLE 1

| Resin (A) | Structure | x:y | Mass average molecular weight |
|---|---|---|---|
| A-1 | | 90:10 | 20300 |
| A-2 | | 70:30 | 17800 |
| A-3 | | 50:50 | 15100 |
| A-4 | | 30:70 | 13500 |
| A-5 | | 10:90 | 12000 |
| A-6 | | 50:50 | 16300 |
| A-7 | | 50:50 | 16500 |

TABLE 1-continued
| Resin (A) | x:y | Mass average molecular weight |
|---|---|---|
| A-8 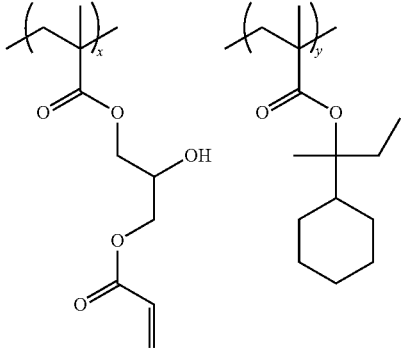 | 50:50 | 19700 |
| A-9 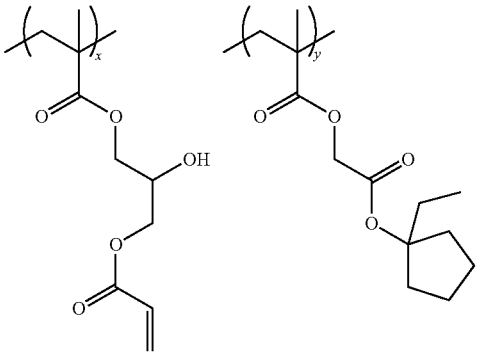 | 50:50 | 21200 |
| A-10 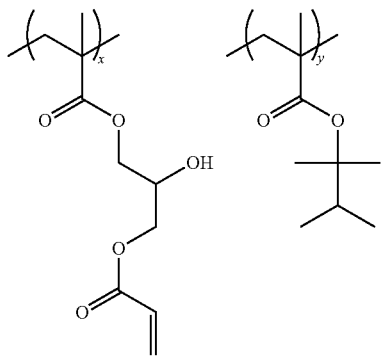 | 50:50 | 14600 |

TABLE 2
| Comparative resin, crosslinking agent | Mass average molecular weight |
|---|---|
| X-1 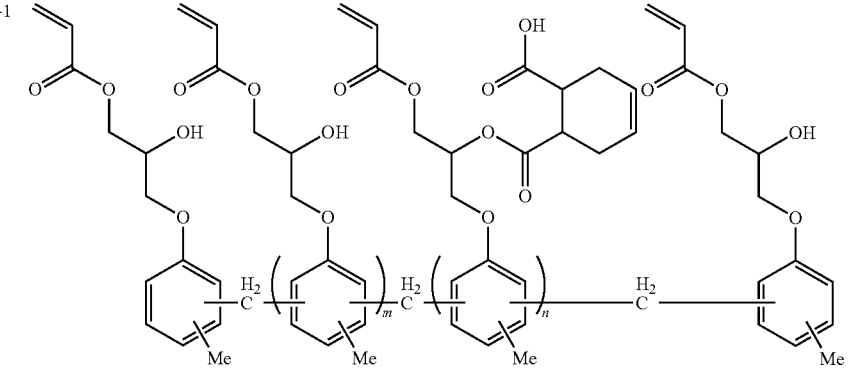 average m + n = 11, average n/(m + n) = 0.5<br>NK OLIGA EA-7440 manufactured by Shin-Nakamura Chemical Co., Ltd. | 4000 |
| X-2 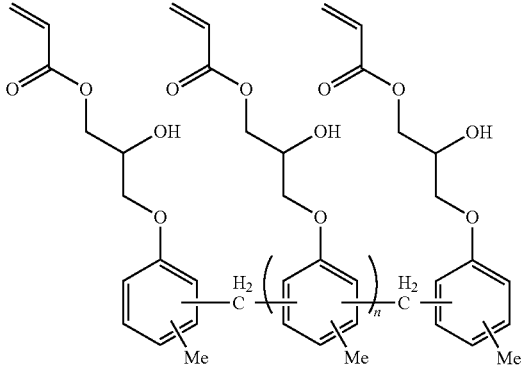 average n = 11<br>NK OLIGA EA-7420 manufactured by Shin-Nakamura Chemical Co., Ltd. | 3500 |
| X-3 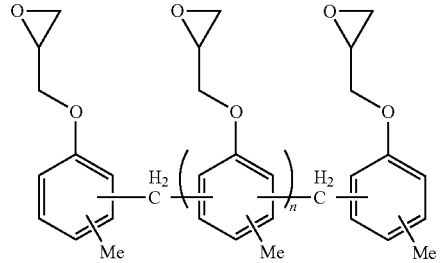 Poly[(o-cresylglycidylether)-co-formaldehyde]<br>(manufactured by Sigma-Aldrich Co. LLC) | 1080 |

TABLE 2-continued

| Comparative resin, crosslinking agent | Mass average molecular weight |
|---|---|
| Y-1 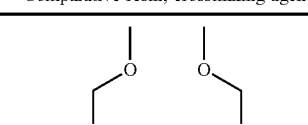 Hexamethoxymethylmelamine (manufactured by Cytec Industries Inc., CYMEL 303 ULF) | 390 |

TABLE 3

| Comparative resin | x:y | Mass average molecular weight |
|---|---|---|
| X-4 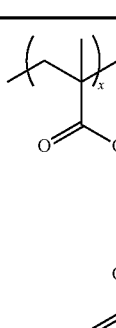 | 50:50 | 13400 |
| X-5 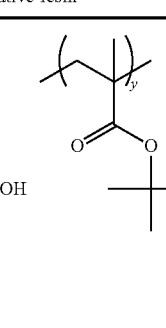 | 50:50 | 18600 |

<Preparation of Resin Composition for Underlayer Film Formation>

The resin composition components were dissolved at the solid content ratio (mass ratio) shown in Tables 4 and 5 and to a total solid content of 0.2 mass % in PGMEA. The solution was filtered through a 0.1 μm polytetrafluoroethylene (PTFE) filter to obtain a resin composition for underlayer film formation.

TABLE 4

| | | Composition of resin composition for underlayer film formation | | | | | | | | | | | |
|---|---|---|---|---|---|---|---|---|---|---|---|---|---|
| | | V1 | V2 | V3 | V4 | V5 | V6 | V7 | V8 | V9 | V10 | V11 | V12 |
| Resin | A-1 | 100 | | | | | | | | | | | |
| | A-2 | | 100 | | | | | | | | | | |
| | A-3 | | | 100 | | | | | | | | 99 | 99 |
| | A-4 | | | | 100 | | | | | | | | |
| | A-5 | | | | | 100 | | | | | | | |
| | A-6 | | | | | | 100 | | | | | | |
| | A-7 | | | | | | | 100 | | | | | |
| | A-8 | | | | | | | | 100 | | | | |
| | A-9 | | | | | | | | | 100 | | | |
| | A-10 | | | | | | | | | | 100 | | |
| Acid and thermal | C-1 | | | | | | | | | | | 1 | |
| acid generator | C-2 | | | | | | | | | | | | 1 |

TABLE 5

| | | Comparative resin composition for underlayer film formation | | | | | | | |
|---|---|---|---|---|---|---|---|---|---|
| | | R1 | R2 | R3 | R4 | R5 | R6 | R7 | R8 |
| Comparative | X-1 | 79 | | 99 | | | | | |
| resin | X-2 | | 79 | | 99 | | | | |
| | X-3 | | | | | 99 | | | |
| | X-4 | | | | | | 100 | | |
| | X-5 | | | | | | | 100 | 99 |
| Crosslinking agent | Y-1 | 20 | 20 | | | | | | |
| Acid and thermal acid generator | C-1 | 1 | 1 | 1 | 1 | 1 | | | 1 |

C-1: p-Toluene sulfonic acid, manufacturer: Wako Pure Chemical Industries, Ltd.
C-2: Isopropyl-p-toluene sulfonate, manufacturer: Wako Pure Chemical Industries, Ltd.

<Formation of Underlayer Film>

A resin composition for underlayer film formation was spin-coated on the surface of a SOG (Spin On Glass) film (surface energy: 55 mJ/m$^2$) formed on a silicon wafer, and heated on a hot plate at 100° C. for 1 minute to dry a solvent. Further, baking (heating) was carried out on a hot plate at 180° C. or 150° C. for 5 minutes, thereby forming an underlayer film on the surface of a silicon wafer having an SOG film. The film thickness of the underlayer film after curing was 5 nm.

<Evaluation of Surface Flatness of Underlayer Film>

Using an atomic force microscope (AFM, Dimension Icon manufactured by Bruker AXS Ltd.), a 10 μm square of the underlayer film obtained above was measured at a 1024×1024 pitch for surface roughness data, and the arithmetic average surface roughness (Ra) was calculated. The results are shown in the following Table. Smaller Ra indicates better surface flatness.

A: Ra<0.3 nm
B: 0.3 nm≤Ra<0.5 nm
C: 0.5 nm≤Ra<1.0 nm
D: 1.0 nm≤Ra

<Preparation of Photocurable Composition for Imprints>

A polymerizable compound, a photopolymerization initiator, and additives shown in the following Table were mixed. Further, 4-hydroxy-2,2,6,6-tetramethylpiperidine-1-oxyl free radicals (manufactured by Tokyo Chemical Industry Co., Ltd.) as a polymerization inhibitor were added to 200 ppm (0.02 mass %) relative to the monomer. This was filtered through a 0.1 μm PTFE filter to prepare a photocurable composition for imprints. In Table, individual components are given in terms of mass ratio.

TABLE 6

| | Available from | Mass ratio |
|---|---|---|
| M-1 | VISCOAT #192 (manufactured by Osaka Organic Chemical Industry, Ltd.) | 48 |
| M-2 | Synthesized with α,α'-dichloro-m-xylene and acrylic acid | 48 |
| M-3 | R-1620 (manufactured by Daikin Industries, Ltd.) | 2 |
| Photopolymerization initiator | Irgacure 907 (manufactured by BASF GmbH) | 2 |

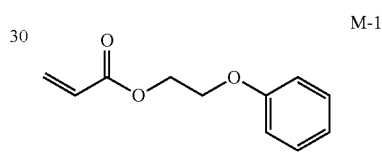

M-1

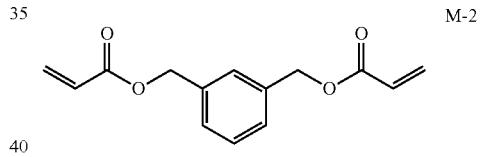

M-2

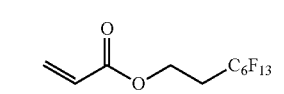

M-3

<Evaluation of Adhesiveness>

The resin composition for underlayer film formation was spin-coated over the surface of a quartz wafer, and heated on a hot plate at 100° C. for 1 minute to thereby dry up the solvent. The resin composition for underlayer film formation was further heated on a hot plate at 180° C. for 5 minutes to thereby form an underlayer film over the quartz wafer surface. The film thickness of the underlayer film after curing was 5 nm.

Over the surface of the underlayer film formed on the above-mentioned silicon wafer having an SOG film, the photocurable composition for imprints conditioned at 25° C. was ejected and applied in a circular pattern having a diameter of 80 mm using an inkjet printer "DMP-2831" manufactured by FUJIFILM Dimatix, Inc., at a liquid droplet volume per nozzle of 1 pl, so as to align droplets according to an approximately 100 μm-pitch square array on the underlayer film, thereby forming a patterning layer. The quartz wafer was then pressed against the silicon wafer so as to bring the underlayer film of the quartz wafer into contact with the patterning layer, followed by exposure to light from the quartz wafer side using a high pressure mercury lamp at an irradiation dose of 300 mJ/cm$^2$. After the exposure, the quartz wafer was separated, and the releasing force at that time was measured according to the method described in the Comparative Examples in paragraphs "0102" to "0107" of JP2011-206977A. More specifically, the measurement was carried out according to separation steps 1 to 6 and 16 to 18 in FIG. 5 of this publication.

The releasing force corresponds to the adhesive force F (unit: N) between the silicon wafer and the photocurable composition for imprints, in which the larger the adhesive force F, the better the adhesiveness of the underlayer film.

S: F≥45N
A: 45N>F≥40N
B: 40N>F≥30N
C: 30N>F≥20N
D: 20N>F

<Evaluation of Separation Failure>

Over the surface of the underlayer film formed on the above-mentioned silicon wafer having an SOG film, the photocurable composition for imprints conditioned at 25° C. was ejected and applied using an inkjet printer "DMP-2831" manufactured by FUJIFILM Dimatix, Inc., at a liquid droplet volume per nozzle of 1 pl, so as to align droplets according to an approximately 100 μm-pitch square array on the underlayer film, thereby forming a patterning layer. A quartz mold (rectangular line/space pattern (1/1), line width=60 nm, groove depth=100 nm, and line edge roughness=3.5 nm) was then pressed against the patterning layer, so as to fill the patterning layer (photocurable composition for imprints) into the mold. This was followed by exposure to light from the mold side using a high pressure mercury lamp at an irradiation dose of 300 mJ/cm², and thereafter the mold was separated. The pattern was thus transferred to the patterning layer.

The pattern thus transferred to the patterning layer was observed under an optical microscope (STM6-LM, manufactured by Olympus Corporation) to evaluate separation failure on the patterning layer.

A: No separation failure observed over total pattern area.
B: Separation failure observed in area less than 5% of total pattern area.
C: Separation failure observed in area 5% or more and less than 50% of total pattern area.
D: Separation failure observed in area 50% or more of total pattern area

TABLE 7

|  | Resin composition for underlayer film formation | Baking temperature | Surface flatness | Adhesiveness | Separation failure |
|---|---|---|---|---|---|
| Example 1 | V1 | 180° C. | B | B | B |
| Example 2 | V2 | 180° C. | A | A | A |
| Example 3 | V3 | 180° C. | A | S | A |
| Example 4 | V4 | 180° C. | A | A | A |
| Example 5 | V5 | 180° C. | A | B | B |
| Example 6 | V6 | 180° C. | A | S | A |
| Example 7 | V7 | 180° C. | A | S | A |
| Example 8 | V8 | 180° C. | A | S | A |
| Example 9 | V9 | 180° C. | A | S | A |
| Example 10 | V10 | 180° C. | A | B | B |
| Example 11 | V3 | 150° C. | A | B | B |
| Example 12 | V11 | 150° C. | A | S | A |
| Example 13 | V12 | 150° C. | A | S | A |
| Comparative Example 1 | R1 | 180° C. | D | A | B |
| Comparative Example 2 | R2 | 180° C. | D | B | C |
| Comparative Example 3 | R3 | 180° C. | C | C | C |

TABLE 7-continued

|  | Resin composition for underlayer film formation | Baking temperature | Surface flatness | Adhesiveness | Separation failure |
|---|---|---|---|---|---|
| Comparative Example 4 | R4 | 180° C. | B | D | D |
| Comparative Example 5 | R5 | 180° C. | C | D | D |
| Comparative Example 6 | R6 | 180° C. | A | C | C |
| Comparative Example 7 | R7 | 180° C. | B | D | D |
| Comparative Example 8 | R1 | 150° C. | B | C | C |
| Comparative Example 9 | R8 | 150° C. | B | D | D |

It is understood from Table above that, by using the resin composition for underlayer film formation according to the present invention, it is now possible to provide an underlayer film having an excellent surface flatness (surface roughness of underlayer film) and a high adhesiveness to an imprint layer. As a consequence, it has become now possible to reduce the separation failure in imprinting (Examples 1 to 13).

Further, an underlayer film having a high adhesive force to an imprint layer could be provided even if the baking temperature was set low (Examples 11 to 13).

In contrast, the resin compositions for underlayer film formation of Comparative Examples were found to be poor in terms of at least one of surface flatness or adhesiveness, and were found to readily result in separation failure (Comparative Examples 1 to 9).

The same results were obtained even when, in individual Examples, the light source for curing the curable composition was changed from the high pressure mercury lamp to an LED, metal halide lamp or excimer lamp.

The same tendencies were confirmed even when, in individual Examples, the substrate used for measurement of adhesive force was changed from the silicon wafer coated with spin-on-glass (SOG) to a silicon wafer or quartz wafer.

EXPLANATION OF REFERENCES

1: base material
2: underlayer film
3: imprint layer
4: mold

What is claimed is:

1. A resin composition for underlayer film formation, comprising a resin having a group represented by General Formula (A) and a group represented by General Formula (B), and a solvent:

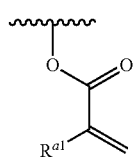

(A)

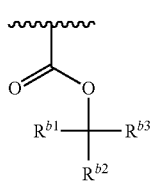

(B)

in General Formulae (A) and (B), the wavy line represents a position connected to the main chain or side chain of the resin, $R^{a1}$ represents a hydrogen atom or a methyl group, and $R^{b1}$ and $R^{b2}$ each independently represent a group selected from an unsubstituted linear or branched alkyl group having 1 to 20 carbon atoms and an unsubstituted cycloalkyl group having 3 to 20 carbon atoms, $R^{b3}$ represents a group selected from an unsubstituted linear or branched alkyl group having 2 to 20 carbon atoms and an unsubstituted cycloalkyl group having 3 to 20 carbon atoms, and $R^{b2}$ and $R^{b3}$ may be bonded to each other to form a ring, wherein the content of the resin is 0.1 to 5 mass %, and the content of the solvent is 95.0 to 99.9 mass %.

2. The resin composition for underlayer film formation according to claim 1, wherein, in General Formula (B), at least one of $R^{b1}$, $R^{b2}$, and $R^{b3}$ is a cycloalkyl group having 3 to 20 carbon atoms, or $R^{b2}$ and $R^{b3}$ are bonded to each other to form a ring.

3. The resin composition for underlayer film formation according to claim 1, wherein the resin has at least one repeating unit selected from the following General Formulae (II) to (IV):

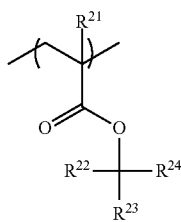

(II)

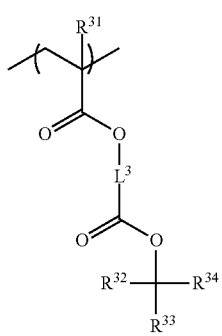

(III)

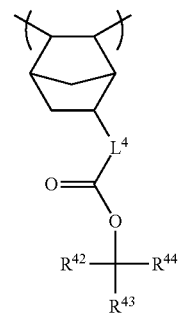

(IV)

in General Formulae (II) to (IV), $R^{21}$ and $R^{31}$ each independently represent a hydrogen atom or a methyl group, $R^{22}$, $R^{23}$, $R^{32}$, $R^{33}$, $R^{42}$, and $R^{43}$ each independently represent a group selected from an unsubstituted linear or branched alkyl group having 1 to 20 carbon atoms and an unsubstituted cycloalkyl group having 3 to 20 carbon atoms, $R^{24}$, $R^{34}$, and $R^{44}$ each independently represent a group selected from an unsubstituted linear or branched alkyl group having 2 to 20 carbon atoms and an unsubstituted cycloalkyl group having 3 to 20 carbon atoms, and $R^{23}$ and $R^{24}$, $R^{33}$ and $R^{34}$, and $R^{43}$ and $R^{44}$ may be bonded to each other to form a ring, and $L^3$ and $L^4$ each independently represent a divalent linking group.

4. The resin composition for underlayer film formation according to claim 1, wherein the resin has a repeating unit represented by General Formula (I), and at least one of a repeating unit represented by General Formula (II) and a repeating unit represented by General Formula (III), and has a mass average molecular weight of 5,000 to 50,000:

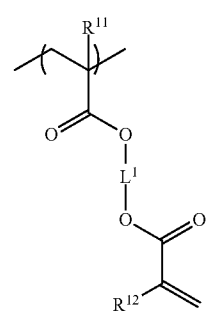

(I)

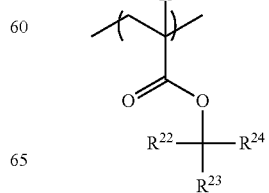

(II)

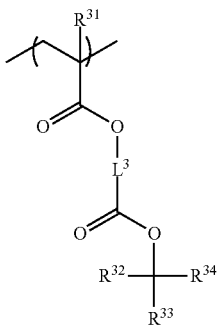

(III)

in General Formulae (I) to (III), $R^{11}$, $R^{12}$, $R^{21}$, and $R^{31}$ each independently represent a hydrogen atom or a methyl group, $R^{22}$, $R^{23}$, $R^{32}$, and $R^{33}$ each independently represent a group selected from an unsubstituted linear or branched alkyl group having 1 to 20 carbon atoms and an unsubstituted cycloalkyl group having 3 to 20 carbon atoms, $R^{24}$ and $R^{34}$ each independently represent a group selected from an unsubstituted linear or branched alkyl group having 2 to 20 carbon atoms and an unsubstituted cycloalkyl group having 3 to 20 carbon atoms, and $R^{23}$ and $R^{24}$, and $R^{33}$ and $R^{34}$ may be bonded to each other to form a ring, and $L^1$ and $L^3$ each independently represent a divalent linking group.

5. The resin composition for underlayer film formation according to claim 4, wherein the resin contains a repeating unit selected from a repeating unit where, in General Formula (II), at least one of $R^{22}$, $R^{23}$, and $R^{24}$ is a cycloalkyl group having 3 to 20 carbon atoms, or $R^{23}$ and $R^{24}$ are bonded to each other to form a ring, and a repeating unit where, in General Formula (III), at least one of $R^{32}$, $R^{33}$, and $R^{34}$ is a cycloalkyl group having 3 to 20 carbon atoms, or $R^{33}$ and $R^{34}$ are bonded to each other to form a ring.

6. The resin composition for underlayer film formation according to claim 4, wherein the resin has a molar ratio of repeating units represented by General Formula (I) and a total of repeating units represented by General Formula (II) and repeating units represented by General Formula (III) of 5:95 to 95:5.

7. The resin composition for underlayer film formation according to claim 1, wherein the solvent is propylene glycol monomethyl ether acetate.

8. The resin composition for underlayer film formation according to claim 1, further comprising at least one of an acid and a thermal acid generator.

9. The resin composition for underlayer film formation according to claim 1, which is used for the formation of an underlayer film for imprints.

10. A layered product having an underlayer film obtained by curing the resin composition for underlayer film formation according to claim 1 on a surface of a base material.

11. A method for forming a pattern, comprising:
applying the resin composition for underlayer film formation according to claim 1 onto a surface of a base material;
heating the applied resin composition for underlayer film formation to form an underlayer film;
applying a photocurable composition onto a surface of the underlayer film;
pressing thereto a mold having a pattern;
curing the photocurable composition by photoirradiation in a state of the mold being pressed; and
separating the mold.

12. The method for forming a pattern according to claim 11, wherein the heating temperature is 120° C. to 250° C. and the heating time is 30 seconds to 10 minutes, in the forming of an underlayer film.

13. A process for producing a device, comprising the method for forming a pattern according to claim 11.

* * * * *